(12) United States Patent
Yeh

(10) Patent No.: US 12,417,982 B2
(45) Date of Patent: Sep. 16, 2025

(54) SEMICONDUCTOR DEVICE WITH CONTACT STRUCTURE

(71) Applicant: NANYA TECHNOLOGY CORPORATION, New Taipei (TW)

(72) Inventor: Chih-Hsuan Yeh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 403 days.

(21) Appl. No.: 17/824,012

(22) Filed: May 25, 2022

(65) Prior Publication Data

US 2023/0387021 A1  Nov. 30, 2023

(51) Int. Cl.
  *H01L 23/535* (2006.01)
  *H01L 21/768* (2006.01)
  *H01L 23/528* (2006.01)

(52) U.S. Cl.
  CPC ...... *H01L 23/535* (2013.01); *H01L 21/76805* (2013.01); *H01L 21/76895* (2013.01); *H01L 23/5283* (2013.01)

(58) Field of Classification Search
  CPC ............. H01L 23/535; H01L 21/76805; H01L 21/76895; H01L 23/5283; H01L 21/0274; H01L 21/31144; H01L 2221/1021; H01L 21/76813; H01L 21/76811
  See application file for complete search history.

(56) References Cited

U.S. PATENT DOCUMENTS

| | | | |
|---|---|---|---|
| 2003/0207180 | A1 | 11/2003 | Shu |
| 2004/0110369 | A1* | 6/2004 | Jiang .............. H01L 21/76802 |
| | | | 257/E21.577 |
| 2004/0149682 | A1 | 8/2004 | Keum |
| 2005/0191855 | A1* | 9/2005 | Chen ................ H01L 21/76807 |
| | | | 257/E21.579 |
| 2006/0014381 | A1 | 1/2006 | Lee |

(Continued)

FOREIGN PATENT DOCUMENTS

| | | |
|---|---|---|
| CN | 108803232 A | 11/2018 |
| CN | 110544671 A | 12/2019 |

(Continued)

OTHER PUBLICATIONS

Office Action mailed on Mar. 2, 2023 related to Taiwanese Application No. 111123954.

(Continued)

*Primary Examiner* — Norman D Richards
*Assistant Examiner* — Ethan Edward Cutler
(74) *Attorney, Agent, or Firm* — Xuan Zhang

(57) ABSTRACT

The present application discloses a semiconductor device with a contact structure. The semiconductor device includes a bottom dielectric layer positioned on a substrate; a bottom conductive layer positioned in the bottom dielectric layer; an etch stop layer positioned on the bottom conductive layer; a first inter-dielectric layer positioned on the etch stop layer; and a contact structure including a body portion positioned along the first inter-dielectric layer and extending to the etch stop layer, and a contact portion positioned in the etch stop layer and contacting the body portion and the bottom conductive layer. A width of the body portion is greater than a width of the contact portion.

12 Claims, 27 Drawing Sheets

(56) References Cited

U.S. PATENT DOCUMENTS

| | | | |
|---|---|---|---|
| 2006/0024948 A1* | 2/2006 | Oh | H01L 21/76807 |
| | | | 438/622 |
| 2006/0128054 A1 | 6/2006 | Kim et al. | |
| 2006/0141773 A1* | 6/2006 | Kim | H01L 21/76807 |
| | | | 257/E21.257 |
| 2008/0202685 A1 | 8/2008 | Fischer et al. | |
| 2013/0113086 A1* | 5/2013 | Bai | C09D 127/18 |
| | | | 257/E21.243 |
| 2014/0001638 A1* | 1/2014 | Fu | H01L 21/768 |
| | | | 257/E23.079 |
| 2014/0242794 A1 | 8/2014 | Lin et al. | |
| 2016/0049330 A1* | 2/2016 | Peng | H01L 23/5226 |
| | | | 257/774 |
| 2020/0006140 A1 | 1/2020 | Tapily et al. | |
| 2020/0286775 A1* | 9/2020 | Wang | H01L 21/7684 |
| 2021/0082742 A1* | 3/2021 | Chen | H01L 23/53209 |
| 2021/0159272 A1* | 5/2021 | Cho | H10B 61/22 |
| 2021/0193513 A1 | 6/2021 | Tien et al. | |
| 2021/0296162 A1* | 9/2021 | Yu | H01L 23/5283 |

FOREIGN PATENT DOCUMENTS

| | | |
|---|---|---|
| CN | 110556298 A | 12/2019 |
| TW | 432617 B | 5/2001 |

OTHER PUBLICATIONS

Office Action mailed on Apr. 21, 2023 related to Taiwanese Application No. 111123954.
Office Action mailed on Aug. 2, 2023 related to Taiwanese Application No. 111123957.
Office Action and search report mailed on Sep. 18, 2024 related to U.S. Appl. No. 17/824,481.

* cited by examiner

SEMICONDUCTOR DEVICE WITH CONTACT STRUCTURE

TECHNICAL FIELD

The present disclosure relates to a semiconductor device, and more particularly, to a semiconductor device with a contact structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a bottom dielectric layer positioned on a substrate; a bottom conductive layer positioned in the bottom dielectric layer; an etch stop layer positioned on the bottom conductive layer; a first inter-dielectric layer positioned on the etch stop layer; and a contact structure including a body portion positioned along the first inter-dielectric layer and extending to the etch stop layer, and a contact portion positioned in the etch stop layer and contacting the body portion and the bottom conductive layer. A width of the body portion is greater than a width of the contact portion.

Another aspect of the present disclosure provides a method for fabricating a semiconductor device including providing a photomask including an opaque layer on a mask substrate and surrounding a translucent layer on the mask substrate, wherein the translucent layer includes a mask opening of contact portion which exposes a portion of the mask substrate; providing a stack structure including an etch stop layer on a bottom conductive layer and a first inter-dielectric layer on the etch stop layer, and forming a pre-process mask layer on the stack structure; patterning the pre-process mask layer using the photomask to form a patterned mask layer including a mask region corresponding to the opaque layer, a region of body portion corresponding to the translucent layer, and a hole of contact portion corresponding to the mask opening of contact portion, wherein a thickness of the region of body portion is less than a thickness of the mask region; performing an opening-etching process to form an opening of body portion and an opening of contact portion in the stack structure to expose a portion of the bottom conductive layer; and forming a contact structure in the opening of body portion and the opening of contact portion. A width of the opening of body portion is greater than a width of the opening of contact portion.

Another aspect of the present disclosure provides a method for fabricating a semiconductor device including providing a photomask including a translucent layer on a mask substrate and including a mask opening of contact portion which exposes a portion of the mask substrate, and an opaque layer on the translucent layer and including a mask opening of body portion which exposes a portion of the translucent layer and the portion of the mask substrate; providing a stack structure including an etch stop layer on a bottom conductive layer and a first inter-dielectric layer on the etch stop layer, and forming a pre-process mask layer on the stack structure; patterning the pre-process mask layer using the photomask to form a patterned mask layer including a mask region corresponding to the opaque layer, a region of body portion corresponding to the translucent layer, and a hole of contact portion corresponding to the mask opening of contact portion; and performing an opening-etching process to form an opening of body portion and an opening of contact portion in the stack structure to expose a portion of the bottom conductive layer, and forming a contact structure in the opening of body portion and the opening of contact portion. A thickness of the region of body portion is less than a thickness of the mask region. A width of the opening of body portion is greater than a width of the opening of contact portion.

Due to the design of the semiconductor device of the present disclosure, the contact structure formed by using the photomask including the translucent layer may have vertical contact sidewalls while keeping the overlay window of the contact structure to the bottom conductive layer large enough. Therefore, the contact resistance may be improved, and the risk of under-etching may be reduced. As a result, the yield and/or performance of the resulting semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
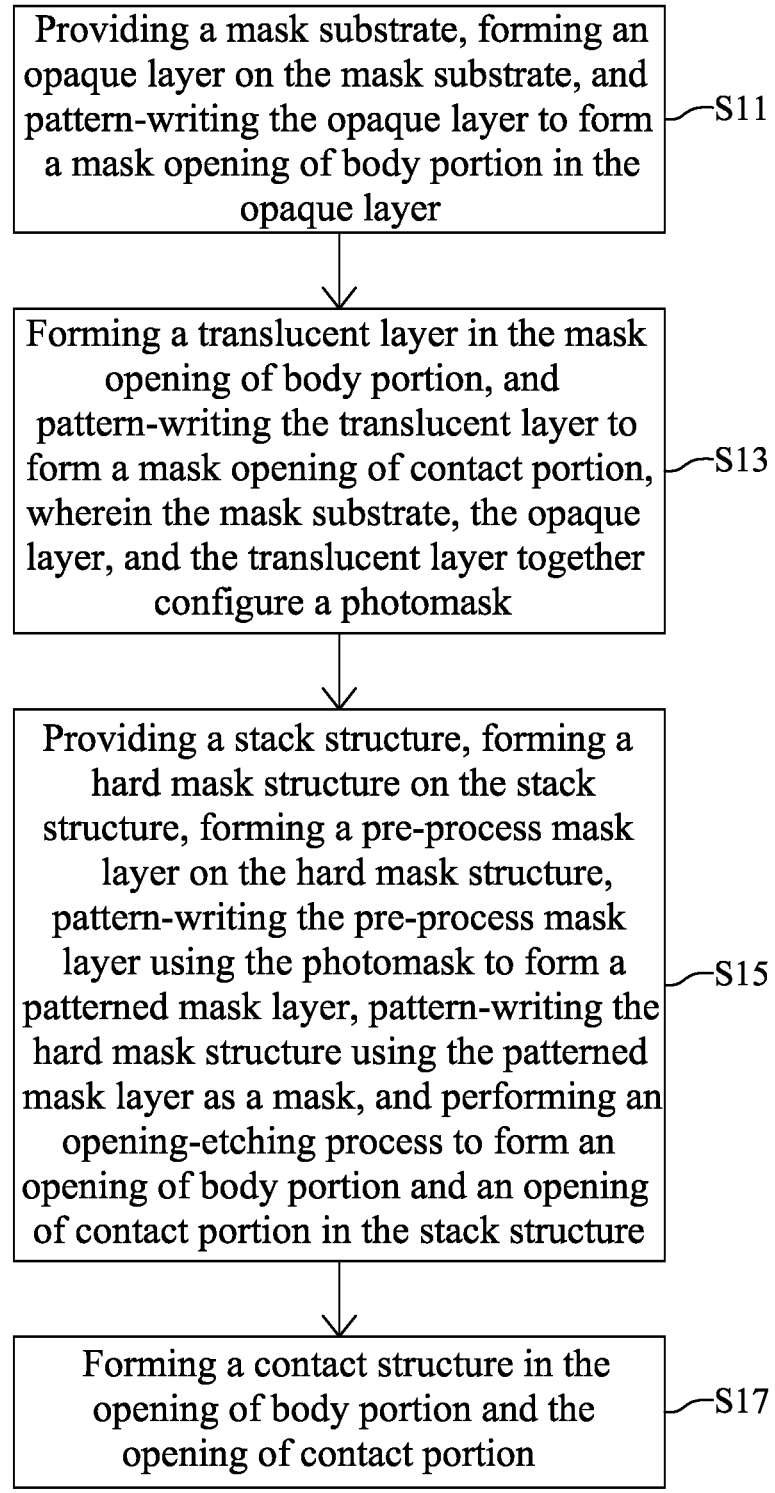
FIG. 1 illustrates, in a flowchart diagram form, a method for fabricating a semiconductor device using a photomask in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A using a photomask 500A in accordance with one embodiment of the present disclosure. FIGS. 2 to 16 illustrate, in schematic cross-sectional view diagrams, a flow for fabricating the semiconductor device 1A using the photomask 500A in accordance with one embodiment of the present disclosure.

Figure 2:
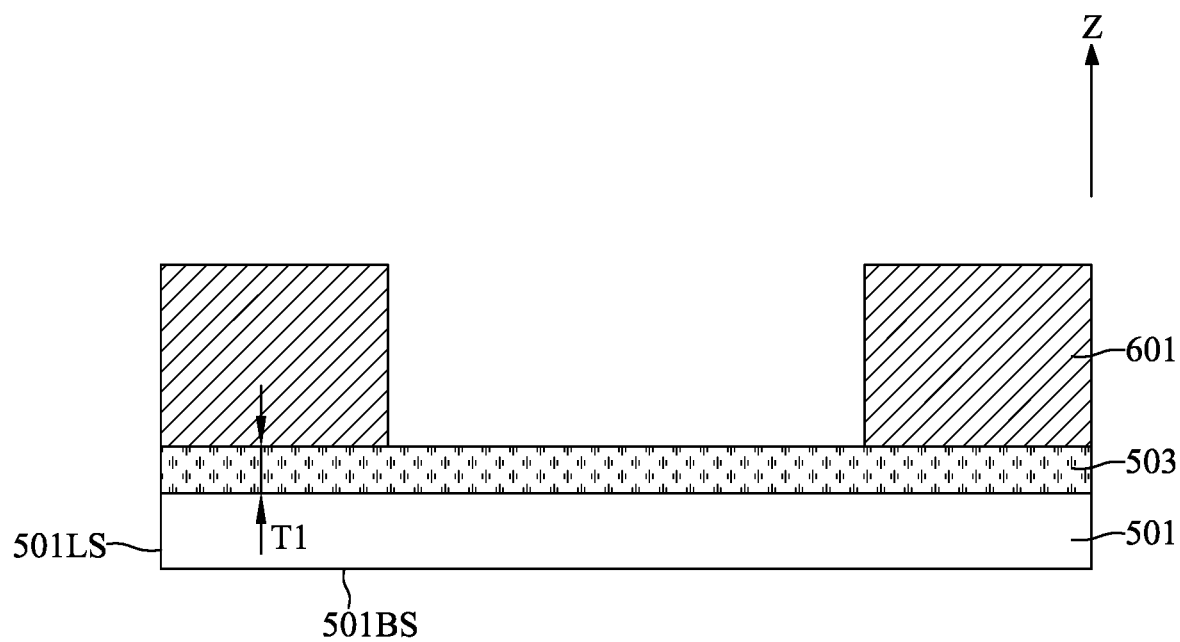
FIGS. 2 to 16 illustrate, in schematic cross-sectional view diagrams, a flow for fabricating the semiconductor device using the photomask in accordance with one embodiment of the present disclosure.
Figure 3:
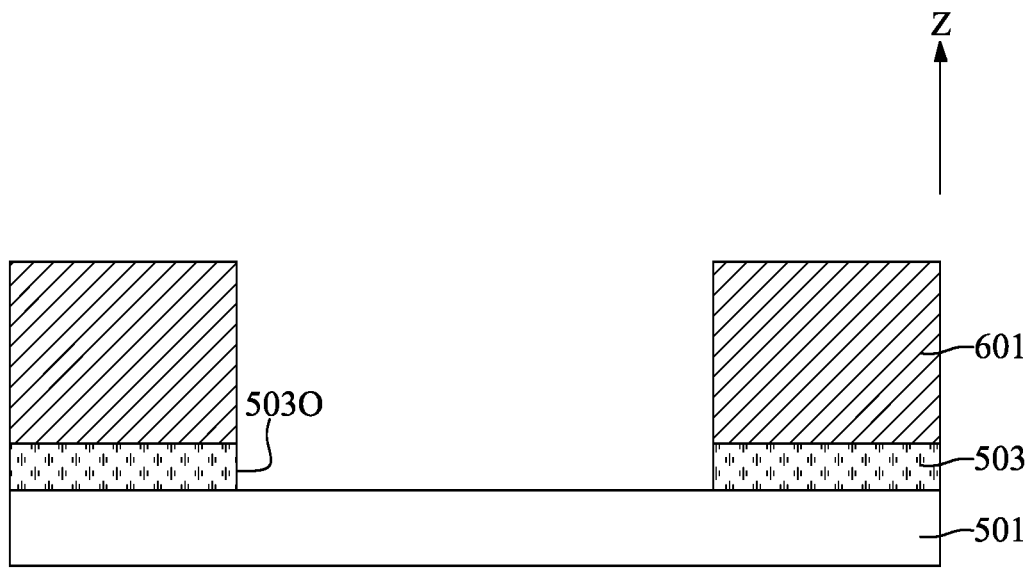

With reference to FIGS. 1 to 3, at step S11, a mask substrate 501 may be provided, an opaque layer 503 may be formed on the mask substrate 501, and the opaque layer 503 may be pattern-written to form a mask opening 503O of body portion in the opaque layer 503.

With reference to FIG. 2, the mask substrate 501 may be formed of, for example, quartz, glass, or any other substantially transparent material. The glass may be, for example, aluminosilicate glass, calcium fluoride or magnesium fluoride, and soda lime glass. In some embodiments, the thickness of the mask substrate 501 may be between about 0.125 inch and about 0.25 inch.

With reference to FIG. 2, the opaque layer 503 may be formed on the mask substrate 501. The opaque layer 503 may be formed of, for example, chrome or other suitable materials that is sufficiently opaque to an incident wavelength of an energy source of an exposure process of a photolithography process as will be illustrated later. In some embodiments, the opaque layer 503 may be formed by, for example, chemical vapor deposition, radio frequency sputtering, or other suitable deposition process. In some embodiments, the thickness T1 of the opaque layer 503 may be between about 500 Angstroms and about 1000 Angstroms. In some embodiments, the opacity of the opaque layer 503 may be 100% or substantially about 100%.

In some embodiments, alternatively, the opaque layer 503 may be formed by an electroplating process. Detailedly, the mask substrate 501 may be coated with a covering layer (not shown) on the bottom surface 501BS and the lateral surface 501LS of the mask substrate 501. Then, the mask substrate 501 coated with the covering layer may be soft baked to enhance the adhesion between the mask substrate 501 and the covering layer, and to drive off all solvent in the covering layer. Subsequently, the mask substrate 501 coated with the covering layer may be immersed in the electroless chrome plating activator for surface activation. Suitable electroless chrome plating activator may be an alkaline solution of chromium chloride and 2-propanol. The activated mask substrate 501 coated with the covering layer may be then immersed in the electroless chrome plating solution for being coated with the opaque layer 503. After the opaque layer 503 is formed on the mask substrate 501 coated with the covering layer, the covering layer may be stripped from the mask substrate 501.

With reference to FIG. 2, a first mask layer 601 may be formed on the opaque layer 503 by a photolithography process. The first mask layer 601 may include a pattern of the mask opening 503O of body portion. In some embodiments, the first mask layer 601 may be a photoresist such as commercially available photoresist OCG895i or other suitable photoresists.

With reference to FIG. 3, a first etching process using the first mask layer 601 as a mask may be performed to remove a portion of the opaque layer 503. After the first etching process, the mask opening 503O of body portion may be formed in the opaque layer 503. A first portion of the top surface of the mask substrate 501 may be exposed through the mask opening 503O of body portion. In some embodiments, the etch rate ratio of the opaque layer 503 to the mask substrate 501 may be between about 100:1 and about 1.05:1, between about 15:1 and about 2:1, or between about 10:1 and about 2:1 during the first etching process. After the mask opening 503O of body portion is formed, the first mask layer 601 may be removed.

With reference to FIG. 1 and FIGS. 4 to 6, at step S13, a translucent layer 505 may be formed in the mask opening 503O of body portion, and the translucent layer 505 may be pattern-written to form a mask opening 505O of contact portion, wherein the mask substrate 501, the opaque layer 503, and the translucent layer 505 together configure a photomask 500A.

Figure 4:
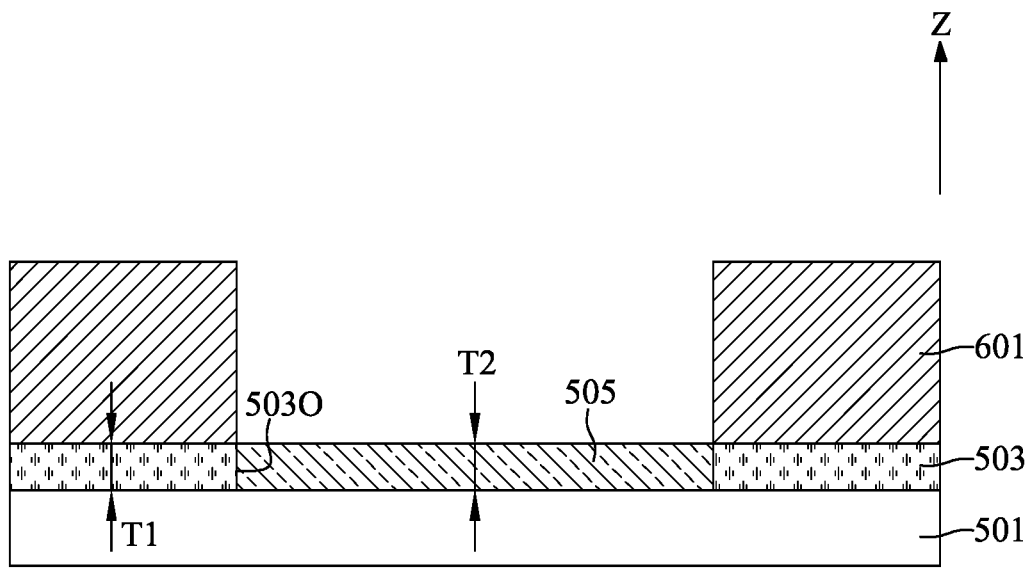

With reference to FIG. 4, the translucent layer 505 may include, for example, molybdenum silicide or silicon nitride. In some embodiments, the translucent layer 505 may be formed by, for example, chemical vapor deposition, sputtering, or other applicable deposition. In some embodiments, the first mask layer 601 may be removed after the formation of the translucent layer 505.

In some embodiments, the thickness T2 of the translucent layer 505 may be substantially the same as the thickness T1 of the opaque layer 503. In some embodiments, the thickness T2 of the translucent layer 505 and the thickness T1 of the opaque layer 503 may be different. For example, the thickness T2 of the translucent layer 505 may be greater than or less than the thickness T1 of the opaque layer 503. In some embodiments, the opacity ratio of the opacity of the translucent layer 505 to the opacity of the opaque layer 503 may be between about 5% and about 95%. In some embodiments, the opacity ratio of the opacity of the translucent layer 505 to the opacity of the opaque layer 503 may be between about 45% and about 75%. It should be noted that the exposed first portion of the top surface of the mask substrate 501 may be completely covered by the translucent layer 505 in the current stage.

Figure 5:
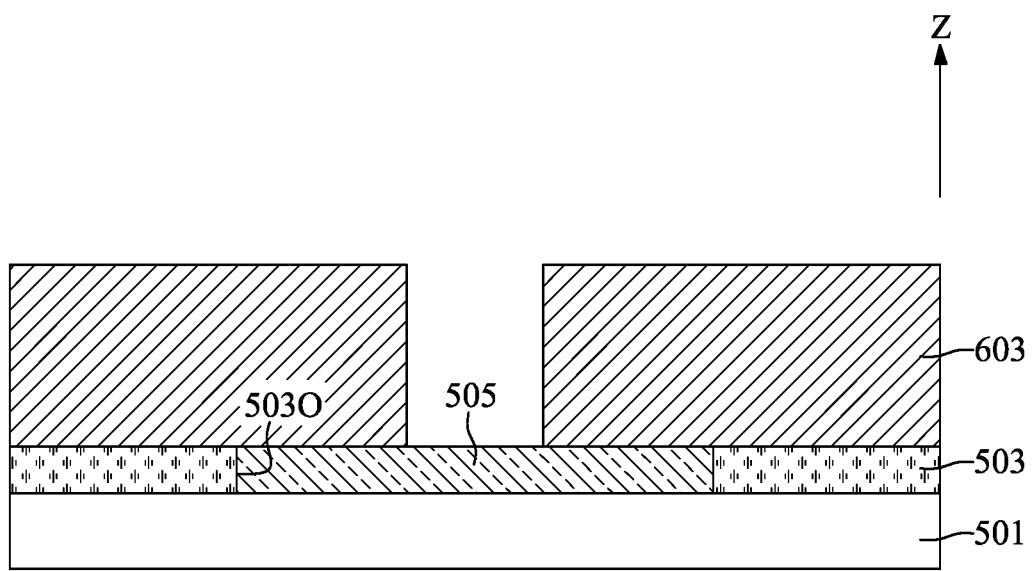

With reference to FIG. 5, a second mask layer 603 may be formed by a photolithography process to cover the opaque layer 503 and a portion of the translucent layer 505. The second mask layer 603 may include a pattern of the mask opening 505O of contact portion. In some embodiments, the second mask layer 603 may be a photoresist such as commercially available photoresist OCG895i or other suitable photoresists.

Figure 6:
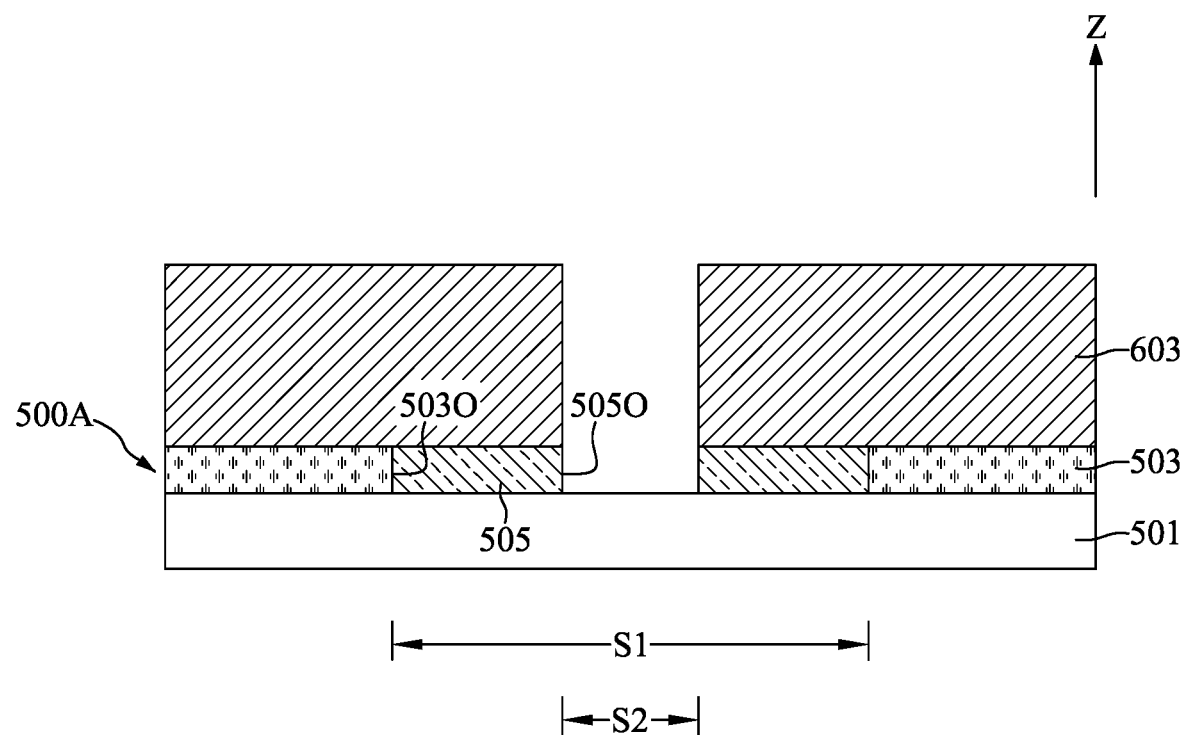

With reference to FIG. 6, a second etching process using the second mask layer 603 as a mask may be performed to remove the exposed portion of the translucent layer 505. After the second etching process, the mask opening 505O of contact portion may be formed in the translucent layer 505. A second portion of the top surface of the mask substrate 501 may be exposed through the mask opening 505O of contact portion. In some embodiments, the etch rate ratio of the translucent layer 505 to the mask substrate 501 may be between about 100:1 and about 1.05:1, between about 15:1 and about 2:1, or between about 10:1 and about 2:1 during the second etching process. After the mask opening 505O of contact portion is formed, the second mask layer 603 may be removed. The surface area S1 of the first portion of the top surface of the mask substrate 501 is greater than the surface area S2 of the second portion of the top surface of the mask substrate 501.

With reference to FIG. 1 and FIGS. 7 to 14, at step S15, a stack structure 100 may be provided, a hard mask structure 200 may be formed on the stack structure 100, a pre-process mask layer 401 may be formed on the hard mask structure 200, the pre-process mask layer 401 may be pattern-written using the photomask 500A to form a patterned mask layer 403, the hard mask structure 200 may be pattern-written using the patterned mask layer 403 as a mask, and an opening-etching process may be performed to form an opening 310O of body portion and an opening 320O of contact portion in the stack structure 100.

Figure 7:
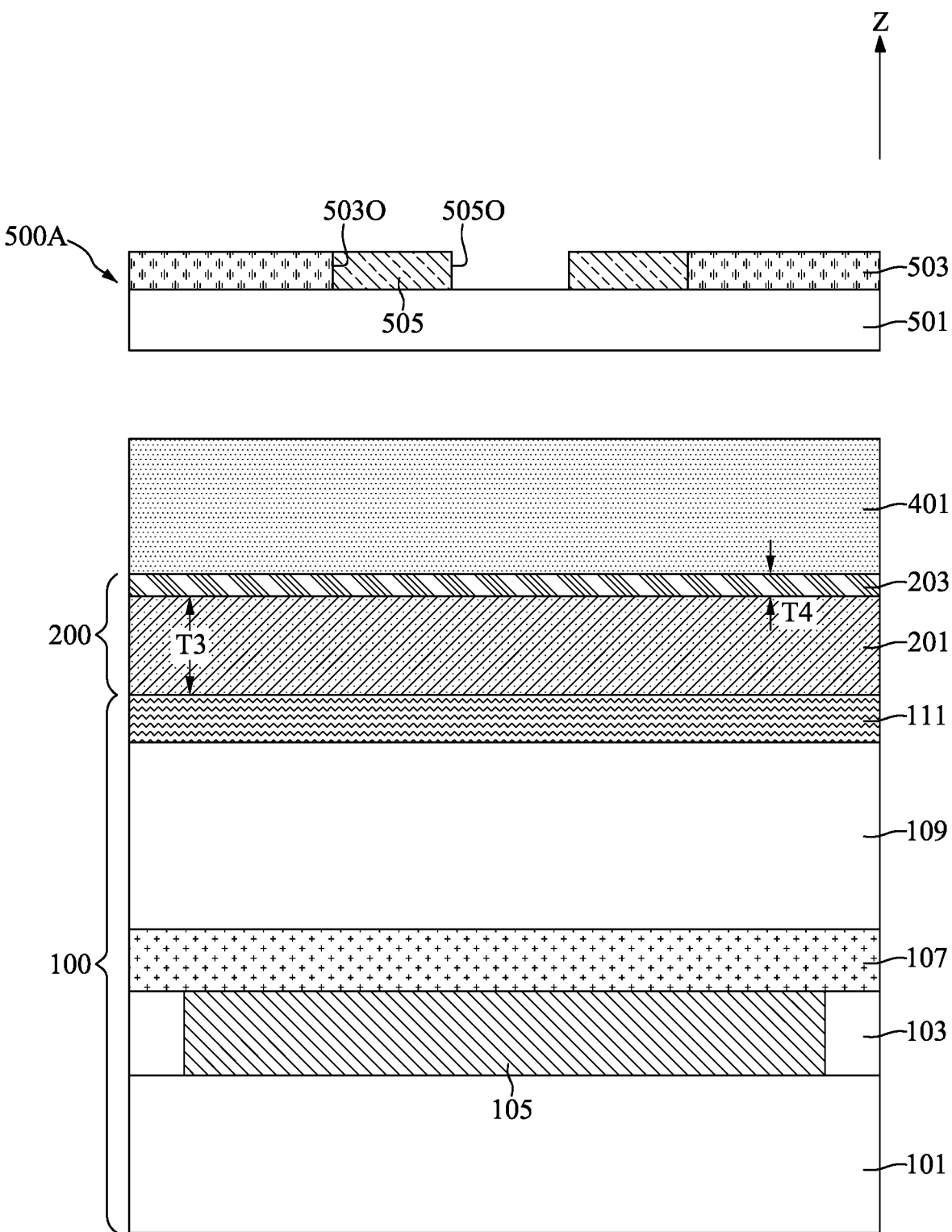

With reference to FIG. 7, the stack structure 100 may include a substrate 101, a bottom dielectric layer 103, a bottom conductive layer 105, an etch stop layer 107, a first inter-dielectric layer 109, and a second dielectric layer 111. In some embodiments, the substrate 101 may include a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Alternatively, in some embodiments, the substrate 101 may further include a plurality of device elements (not show for clarity), a plurality of dielectric layers (not shown for clarity), and a plurality of conductive features (not show for clarity).

The plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

The plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 7, in some embodiments, the bottom dielectric layer 103 may be formed on the substrate 101 and may be formed of, for example, silicon dioxide, undoped silicate glass, fluorosilicate glass, borophosphosilicate glass, or a combination thereof. In some embodiments, the bottom dielectric layer 103 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the bottom dielectric layer 103 may include a self-planarizing material such as a spin-on glass or a spin-on low-k dielectric material such as SiLK™. The use of a self-planarizing dielectric material may avoid the need to perform a subsequent planarizing step. In some embodiments, the bottom dielectric layer 103 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 7, the bottom conductive layer 105 may be formed in the bottom dielectric layer 103. The bottom conductive layer 105 may be formed of, for example, tungsten. In some embodiments, the bottom conductive layer 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In the present embodiment, the bottom conductive layer 105 may be referred to as the MO.

With reference to FIG. 7, the etch stop layer 107 may be formed on the bottom dielectric layer 103. Generally, the etch stop layer(s) may provide a mechanism to stop an etching process when forming conductive features. The etch stop layer(s) may be preferably formed of a dielectric material having a different etch selectivity from adjacent layers. For example, the etch stop layer 107 may be formed of silicon nitride, silicon carbonitride, silicon oxycarbide, the like, or a combination thereof. The etch stop layer 107 may be deposited by chemical vapor deposition or plasma enhanced chemical vapor deposition.

With reference to FIG. 7, the first inter-dielectric layer 109 may be formed on the etch stop layer 107. The first inter-dielectric layer 109 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first inter-dielectric layer 109 may include a self-planarizing material such as a spin-on glass or a spin-on low-k dielectric material such as SiLK™ The use of a self-planarizing dielectric material may avoid the need to perform a subsequent planarizing step. In some embodiments, the first inter-dielectric layer 109 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 7, the first second dielectric layer 111 may be formed on the first inter-dielectric layer 109. In some embodiments, the second dielectric layer 111 may be formed of the same material as the first inter-dielectric layer 109. In some embodiments, the second dielectric layer 111 may be formed of a different material as the first inter-dielectric layer 109. For example, the second dielectric layer 111 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 111 may include a self-planarizing material such as a spin-on glass or a spin-on low-k dielectric material such as SiLK™. The use of a self-planarizing dielectric material may avoid the need to perform a subsequent planarizing step. In some embodiments, the second dielectric layer 111 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 7, the thickness of the first inter-dielectric layer 109 may be greater than the thickness of the second dielectric layer 111. In some embodiments, the second dielectric layer 111 may be optional.

With reference to FIG. 7, the hard mask structure 200 may be formed on the second dielectric layer 111 or on the first inter-dielectric layer 109 if the second dielectric layer 111 is absent. The hard mask structure 200 may include a first hard mask layer 201 and an anti-reflective coating layer 203.

In some embodiments, the first hard mask layer 201 may have a thickness T3 between about 80 nm and about 500 nm. In some embodiments, the thickness T3 of the carbon hard mask layer 105 may be between about 100 nm and about 200 nm.

In some embodiments, the first hard mask layer 201 may be formed of, for example, a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the first hard mask layer 201 may be formed by a high-density plasma chemical vapor deposition process. The high-density plasma may be generated using inductively coupled radio frequency (RF) power in a range between about 500 watts and about 4000 watts. In some embodiments, the high-density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm. The process pressure of the high-density plasma chemical vapor deposition process may be about 5 millitorr and about 20 millitorr. The process temperature of the high-density plasma chemical vapor deposition process may be between about 240° C. and about 340° C.

Alternatively, in some embodiments, the first hard mask layer 201 may be formed of, for example, boron nitride, silicon boron nitride, phosphorus boron nitride, boron carbon silicon nitride, or the like. The first hard mask layer 201 may be formed by a film formation process and a treatment process. Detailedly, in the film formation process, first precursors, which may be boron-based precursors, may be introduced over the second dielectric layer 111 (or the first inter-dielectric layer 109) to form a boron-based layer. Subsequently, in the treatment process, second precursors, which may be nitrogen-based precursors, may be introduced to react with the boron-based layer and turn the boron-based layer into the first hard mask layer 201. In some embodiments, the first precursors may be, for example, diborane, borazine, or an alkyl-substituted derivative of borazine. In some embodiments, the second precursors may be, for example, ammonia or hydrazine.

With reference to FIG. 7, the anti-reflective coating layer 203 may be formed on the first hard mask layer 201. The anti-reflective coating layer 203 may be used to reduce reflections off an underlying material, standing waves, thin-film interference, and specular reflections. In some embodiments, the anti-reflective coating layer 203 may consist of thin film structures with alternating layers of contrasting refractive index. In some embodiments, the anti-reflective coating layer 203 may be, for example, AR 40 Anti-Reflectant supplied commercially by Rohm and Haas Electronic Materials (Phoenix, Ariz.) In some embodiments, the thickness T4 of the anti-reflective coating layer 203 may be between about 30 nm and about 50 nm. In some embodiments, the anti-reflective coating layer 203 may be optional.

With reference to FIG. 7, the pre-process mask layer 401 may be formed on the hard mask structure 200 by, for example, spin-on coating. A soft bake process may be performed to drive out solvent remaining in the pre-process mask layer 401. In some embodiments, the pre-process mask layer 401 may be a photoresist such as commercially available photoresist OCG895i or other suitable photoresists.

With reference to FIG. 7, the photomask 500A may be positioned over the stack structure 100 and align with the stack structure 100.

Figure 8:
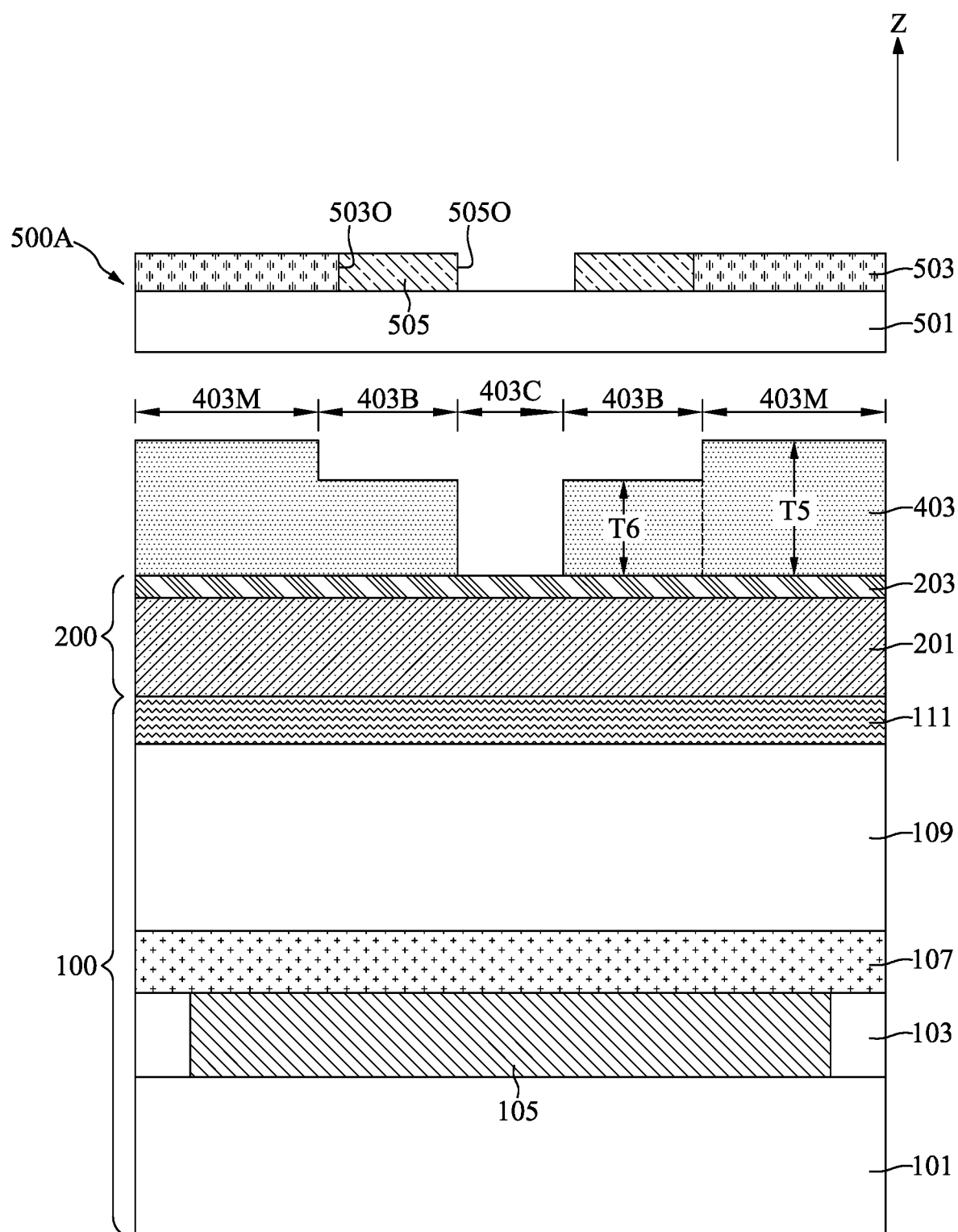

With reference to FIG. 8, an exposure process may be performed using the photomask 500A. The exposure process may be performed using a radiation source. The radiation source may be, for example, ultraviolet radiation, deep ultraviolet radiation (typically 193 nm or 248 nm), or extreme ultraviolet radiation (typically 13.5 nm). A post-exposure bake process may be immediately performed after the exposure process. Subsequently, a development process may be performed. During the development process, an aqueous base solution may be added to the exposed and baked pre-process mask layer 401, and a portion of the pre-process mask layer 401 may be dissolved. After the exposure process, the post-exposure bake process, and the development process, the pre-process mask layer 401 may be turned into the patterned mask layer 403.

With reference to FIG. 8, the patterned mask layer 403 may include a mask region 403M, a region 403B of body portion, and a hole 403C of contact portion. The mask region 403M may surround the region 403B of body portion. The mask region 403M may correspond to the opaque layer 503. That is, the mask region 403M and the opaque layer 503 may be completely overlapped to each other in a top-view perspective (not shown). The region 403B of body portion may correspond to the translucent layer 505. That is, the region 403B of body portion and the translucent layer 505 may be completely overlapped to each other in a top-view perspective (not shown). The space surrounded by the region 403B of body portion is referred to as the hole 403C of contact portion. A portion of the top surface of the hard mask structure 200 may be exposed through the hole 403C of contact portion. The hole 403C of contact portion may correspond to the mask opening 505O of contact portion. That is, the hole 403C of contact portion and the mask opening 505O of contact portion may be completely overlapped to each other in a top-view perspective (not shown).

With reference to FIG. 8, the thickness T5 of the mask region 403M may be greater than the thickness T6 of the region 403B of body portion. In some embodiments, the thickness ratio of the thickness T6 of the region 403B of body portion to the thickness T5 of the mask region 403M may be between about 25% and about 85%. In some embodiments, the thickness ratio of the thickness T6 of the region 403B of body portion to the thickness T5 of the mask region 403M may be between about 45% and about 65%.

With reference to FIGS. 9 to 12, a hard-mask-etching process using the patterned mask layer 403 as the mask may be performed to pattern-write the hard mask structure 200. In some embodiments, the hard-mask-etching process may be an anisotropic etching process. In some embodiments, the hard-mask-etching process may include multiple stages such as four stages but is not limited thereto.

Figure 9:
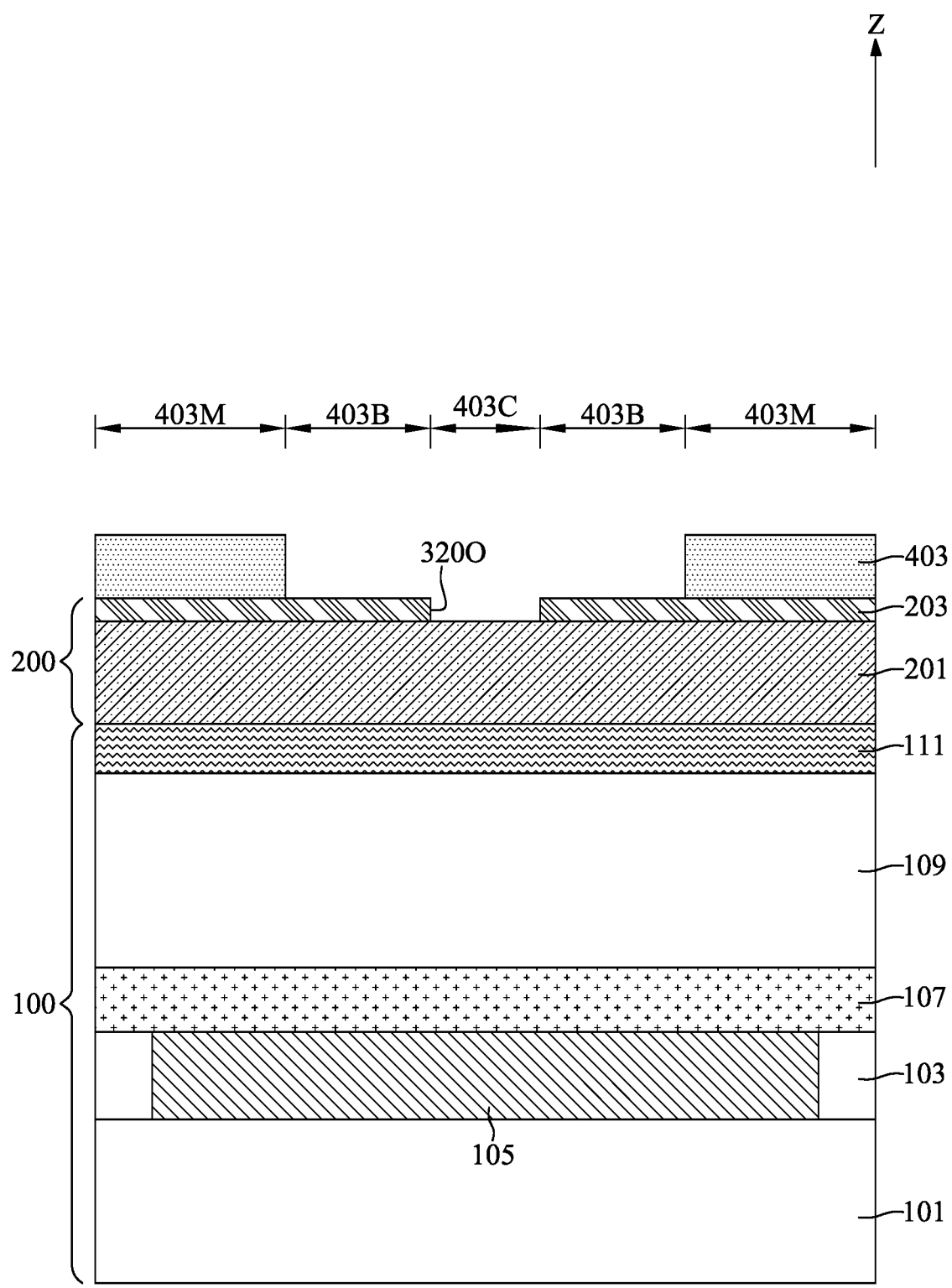

With reference to FIG. 9, during the first stage of the hard-mask etching process, the hard mask structure 200 under the region 403B of body portion may be temporarily protected by the region 403B of body portion of the patterned mask layer 403. Detailedly, during the first stage of the hard-mask-etching process, the region 403B of body portion of the patterned mask layer 403 may serve as an etching buffer to protect the underneath anti-reflective coating layer 203. As a result, the anti-reflective coating layer 203 corresponding to the region 403B of body portion may be intact during the first stage of the hard-mask-etching process. It should be noted that the region 403B of body portion of the patterned mask layer 403 may be continually consumed during the first stage of the hard-mask-etching process. The region 403B of body portion may be completely consumed or only be left a little after the first stage of the hard-mask-etching process.

In contrast, for the anti-reflective coating layer 203 corresponding to the hole 403C of contact portion of the patterned mask layer 403, no patterned mask layer 403 is present to serve as a temporary etching buffer. Hence, in the first stage of the hard-mask-etching process, the anti-reflective coating layer 203 corresponding to the hole 403C of contact portion is removed while the anti-reflective coating layer 203 corresponding to the region 403B of body portion is still protected by the region 403B of body portion of the patterned mask layer 403. As a result, after the first stage of the hard-mask-etching process, the anti-reflective coating layer 203 corresponding to the hole 403C of contact portion may be removed to form the opening 320O of contact portion along the anti-reflective coating layer 203. A portion of the first hard mask layer 201 may be exposed through the opening 320O of contact portion. In some embodiments, a small portion of the first hard mask layer 201 exposed through the opening 320O of contact portion may be also removed during the first stage of the hard-mask-etching process. In other words, the opening 320O of contact portion may be extended to the first hard mask layer 201 (not shown).

In some embodiments, the etch rate ratio of the patterned mask layer 403 to the anti-reflective coating layer 203 may be between about 20:1 and about 1.5:1, between about 10:1 and about 2:1, or between about 5:1 and about 2:1 during the first stage of the hard-mask-etching process. In some embodiments, the etch rate ratio of the patterned mask layer 403 to the first hard mask layer 201 may be between about 100:1 and about 2:1, between about 15:1 and about 2:1, or between about 10:1 and about 2:1 during the first stage of the hard-mask-etching process.

Figure 10:
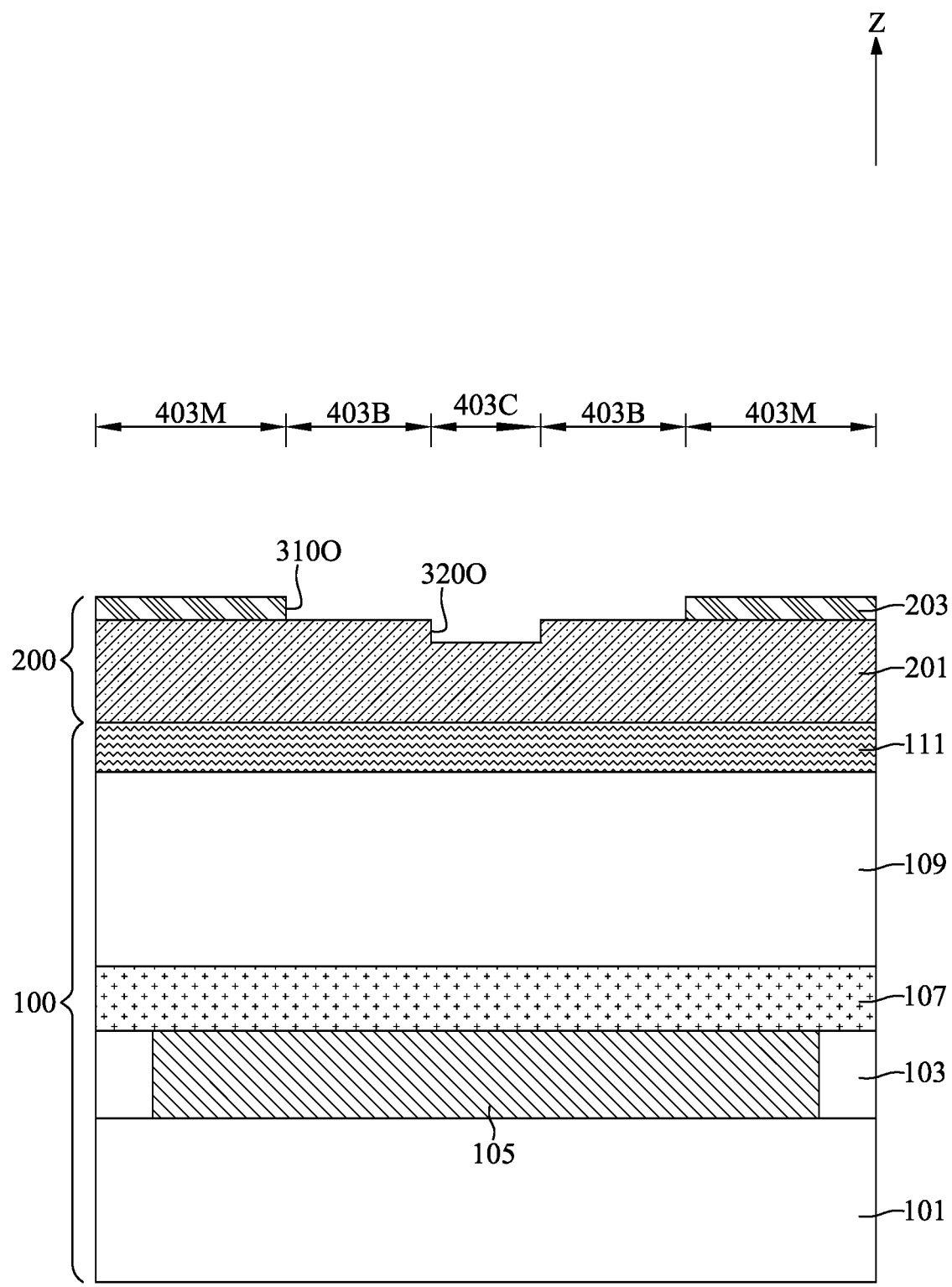

With reference to FIG. 10, during the second stage of the hard-mask-etching process, the anti-reflective coating layer 203 corresponding to the region 403B of body portion may be removed due to the region 403B of body portion is completely consumed during the first stage of the hard-mask-etching process. As a result, the opening 320O of contact portion along the anti-reflective coating layer 203 may be broadened to the opening 310O of body portion along the anti-reflective coating layer 203. In some embodiments, a little portion of the first hard mask layer 201 corresponding to the region 403B of body portion may be also removed. In other words, the opening 310O of body portion may extend to the first hard mask layer 201 (not shown).

Meanwhile, the first hard mask layer 201 exposed through the opening 320O of contact portion (before broadening) may be removed to extend the opening 320O of contact portion to the first hard mask layer 201. It should be noted that the opening 320O of contact portion is deeper than the opening 310O of body portion, and the opening 310O of body portion and the opening 320O of contact portion communicate with each other. The patterned mask layer 403 may be completely consumed or only be left a little (e.g., the mask region 403M may be left, not shown) after the second stage of the hard-mask-etching process.

In some embodiments, the second stage of the hard-mask-etching process and the first stage of the hard-mask-etching process may be performed with the same etching recipe. In some embodiments, the etch rate ratio of the patterned mask layer 403 to the anti-reflective coating layer 203 may be between about 20:1 and about 1.5:1, between about 10:1 and about 2:1, or between about 5:1 and about 2:1 during the second stage of the hard-mask-etching process. In some embodiments, the etch rate ratio of the patterned mask layer 403 to the first hard mask layer 201 may be between about 100:1 and about 2:1, between about 15:1 and about 2:1, or between about 10:1 and about 2:1 during the second stage of the hard-mask-etching process.

Figure 11:
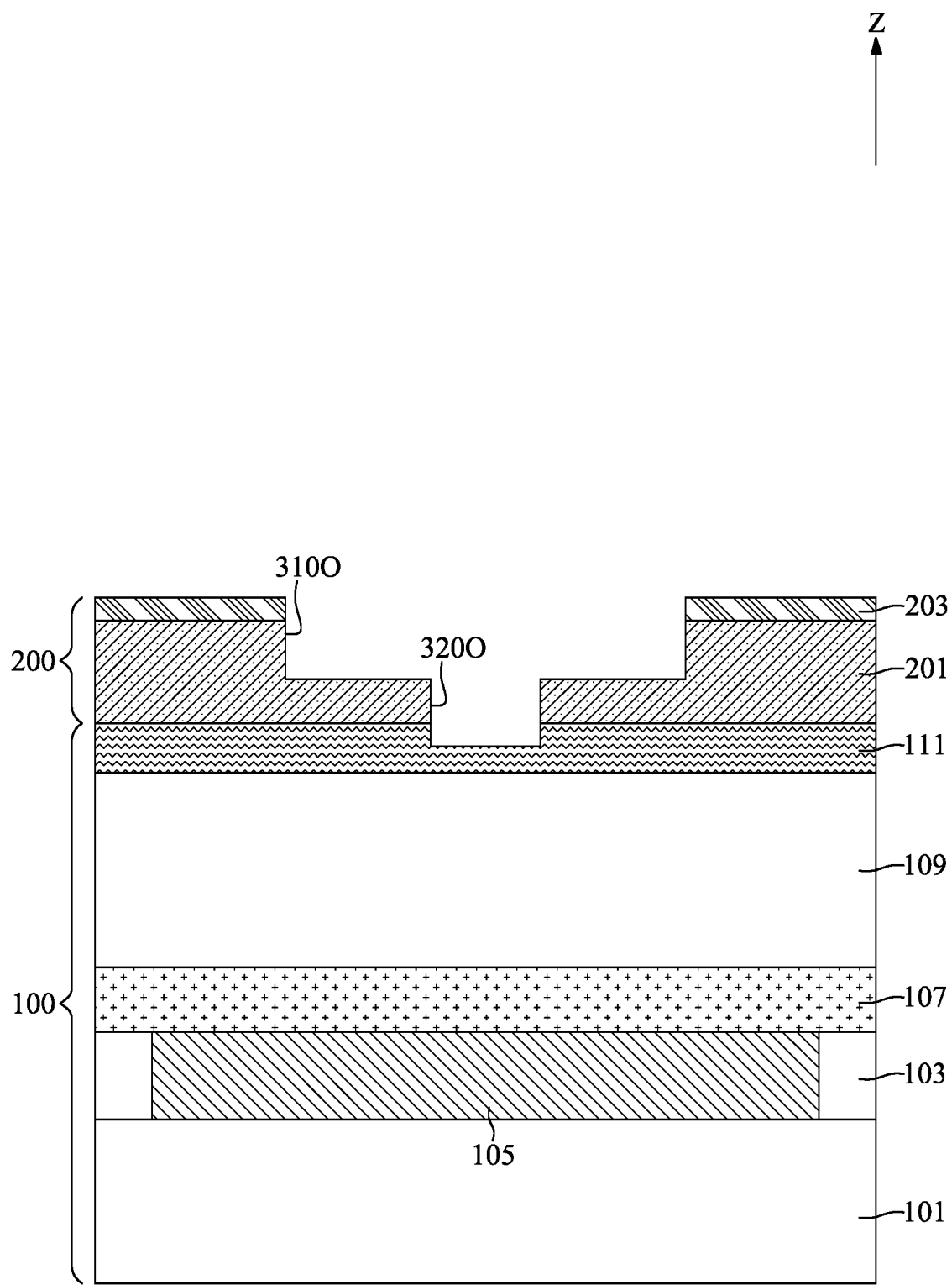

With reference to FIG. 11, during the third stage of the hard-mask-etching process, the first hard mask layer 201 exposed through the opening 310O of body portion and the opening 320O of contact portion may be simultaneously removed. That is, the opening 320O of contact portion may be deepened toward the second dielectric layer 111, and the opening 310O of body portion may extend to the first hard mask layer 201. In some embodiments, a portion of the second dielectric layer 111 exposed through the opening 320O of contact portion may be also removed. In other words, the opening 320O of contact portion may extend to the second dielectric layer 111. It should be noted that the opening 320O of contact portion is still deeper than the opening 310O of body portion.

In some embodiments, the third stage of the hard-mask-etching process and the second stage of the hard-mask-etching process may be performed with different etching recipes. In some embodiments, the etch rate ratio of the first hard mask layer 201 to the anti-reflective coating layer 203 may be between about 100:1 and about 1.5:1, between about 50:1 and about 2:1, or between about 5:1 and about 2:1 during the third stage of the hard-mask-etching process. In some embodiments, the etch rate ratio of the second dielectric layer 111 to the anti-reflective coating layer 203 may be between about 50:1 and about 2:1, between about 15:1 and about 2:1, or between about 5:1 and about 2:1 during the third stage of the hard-mask-etching process.

Figure 12:
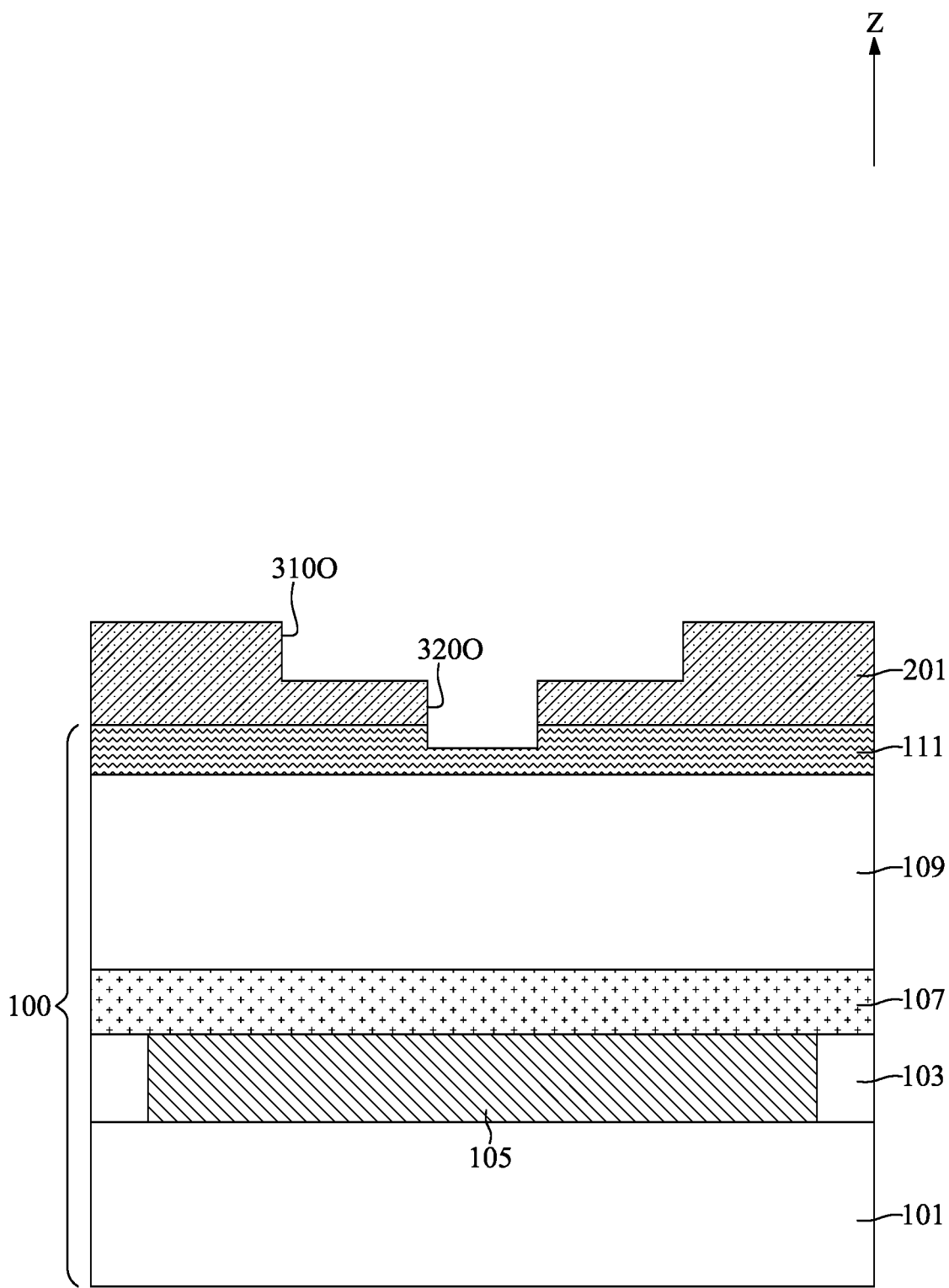

With reference to FIG. 12, during the fourth stage of the hard-mask-etching process, the anti-reflective coating layer 203 may be completely removed. The opening 310O of body portion and the opening 320O of contact portion may be kept the same depth/profile as in the third stage of the hard-mask-etching process or the opening 310O of body portion and the opening 320O of contact portion may be slightly deepen comparing to the third stage of the hard-mask-etching process.

In some embodiments, the fourth stage of the hard-mask-etching process and the third stage of the hard-mask-etching process may be performed with different etching recipes. In some embodiments, the etch rate ratio of the anti-reflective coating layer 203 to the first hard mask layer 201 may be between about 100:1 and about 1.5:1, between about 50:1 and about 2:1, or between about 5:1 and about 2:1 during the fourth stage of the hard-mask-etching process. In some embodiments, the etch rate ratio of the anti-reflective coating layer 203 to the second dielectric layer 111 may be between about 100:1 and about 2:1, between about 50:1 and about 2:1, or between about 5:1 and about 2:1 during the fourth stage of the hard-mask-etching process.

In some embodiments, the fourth stage of the hard-mask-etching process may be optional. The remaining anti-reflective coating layer 203 may serve as part of the mask during the subsequent opening-etching process.

Figure 13:
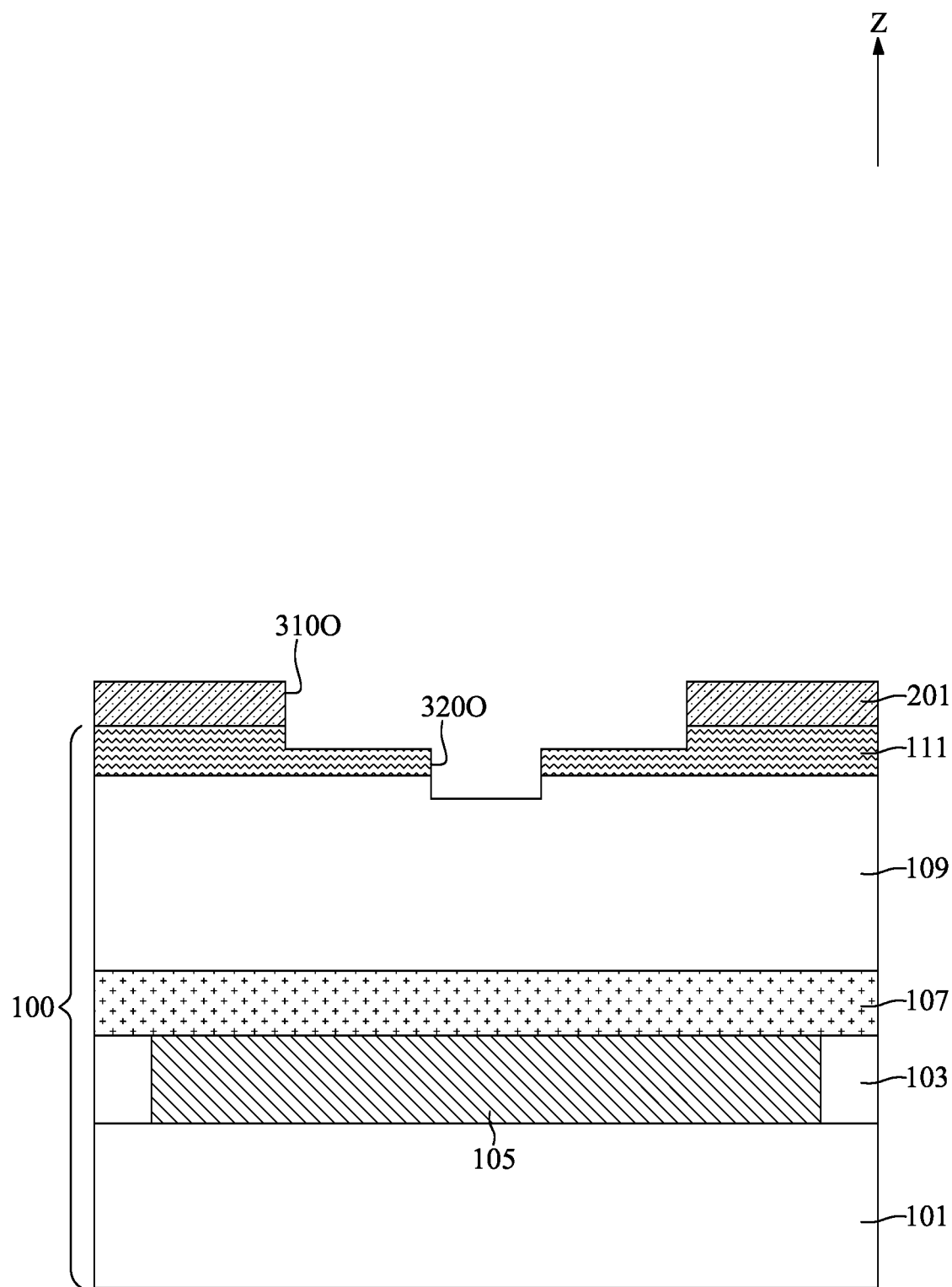
Figure 14:
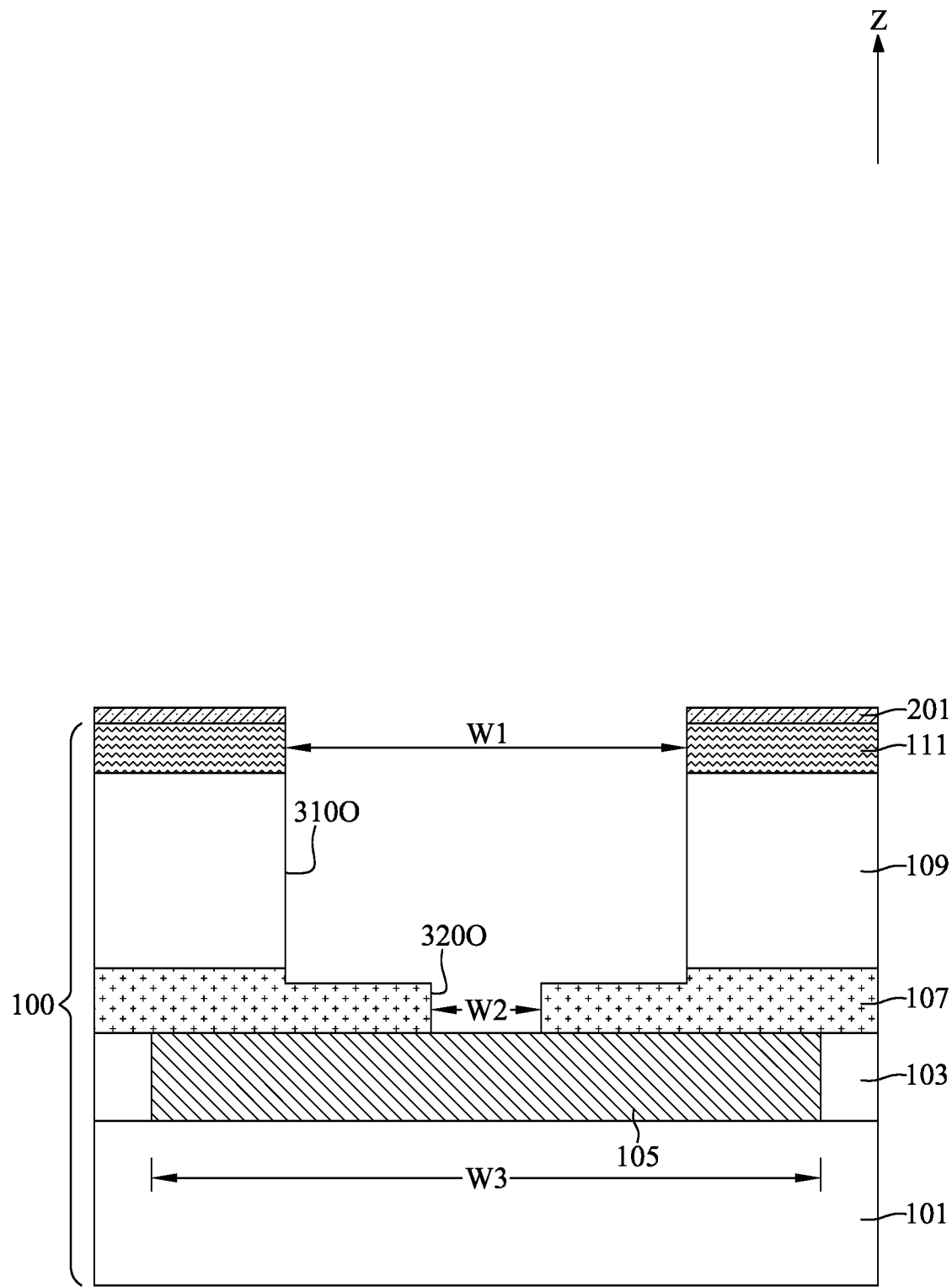

With reference to FIGS. 13 and 14, the opening-etching process using the patterned first hard mask layer 201 as the mask may be performed. In some embodiments, the opening-etching process may be an anisotropic process. In some embodiments, the opening-etching process may include multiple stages such as two stages but is not limited thereto. In some embodiments, the opening-etching process may be a polymer-less process which results in less polymer redeposition on the sidewalls of openings. The openings fabricating with less polymer redeposition may have a more straight sidewall profile.

With reference to FIG. 13, during the first stage of the opening-etching process, the opening 320O of contact portion and the opening 310O of body portion may be simultaneously deepened. The opening 320O of contact portion may extend to the first inter-dielectric layer 109 and the opening 310O of body portion may extend to the second dielectric layer 111. The first hard mask layer 201 may be continuously consumed during the first stage of the opening-etching process.

In some embodiments, the etch rate ratio of the second dielectric layer 111 to the first hard mask layer 201 may be between about 50:1 and about 1.5:1, between about 15:1 and about 2:1, or between about 5:1 and about 2:1 during the first stage of the opening-etching process. In some embodiments, the etch rate ratio of the first inter-dielectric layer 109 to the first hard mask layer 201 may be between about 50:1 and about 2:1, between about 15:1 and about 2:1, or between about 5:1 and about 2:1 during the first stage of the opening-etching process.

With reference to FIG. 14, during the second stage of the opening-etching process, the opening 320O of contact portion and the opening 310O of body portion may be simultaneously deepened. The opening 320O of contact portion may extend to the etch stop layer 107. A portion of the bottom conductive layer 105 may be exposed through the opening 320O of contact portion. The opening 310O of body portion may extend to the etch stop layer 107. It should be noted that the opening 320O of contact portion is still deeper than the opening 310O of body portion. The first hard mask layer 201 may be continuously consumed during the second stage of the opening-etching process. After the opening-etching process, the first hard mask layer 201 may be completely removed or may be left a little. An additional removal process may be performed to remove the remaining first hard mask layer 201.

In some embodiments, the etch rate ratio of the second dielectric layer 111 to the first hard mask layer 201 may be between about 100:1 and about 1.5:1, between about 50:1 and about 2:1, or between about 5:1 and about 2:1 during the second stage of the opening-etching process. In some embodiments, the etch rate ratio of the first inter-dielectric layer 109 to the first hard mask layer 201 may be between about 100:1 and about 2:1, between about 50:1 and about 2:1, or between about 5:1 and about 2:1 during the second stage of the opening-etching process. In some embodiments, the etch rate ratio of the etch stop layer 107 to the first hard mask layer 201 may be between about 100:1 and about 2:1, between about 50:1 and about 2:1, or between about 5:1 and about 2:1 during the second stage of the opening-etching process.

In some embodiments, the width W1 of the opening 310O of body portion may be greater than the width W2 of the opening 320O of contact portion. In some embodiments, the width ratio of the width W2 of the opening 320O of contact portion to the width W1 of the opening 310O of body portion may be between about 10% and about 75% or between about 30% and about 60%. In some embodiments, the width W3 of the bottom conductive layer 105 may be greater than the width W1 of the opening 310O of body portion. In some embodiments, the width ratio of the width W1 of the opening 310O of body portion to the width W3 of the bottom conductive layer 105 may be between about 5% and about 70% or between about 10% and about 50%.

Figure 15:
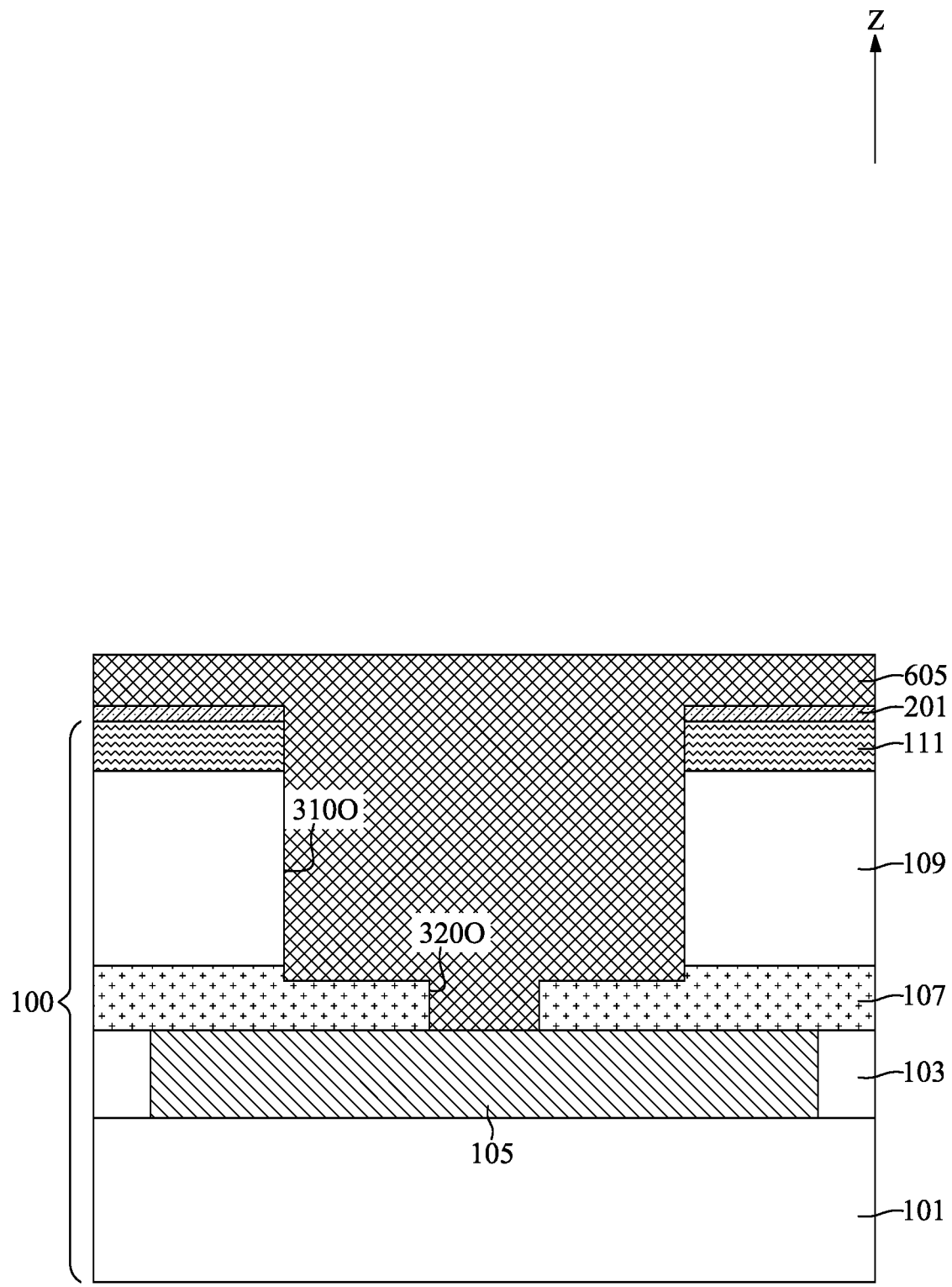
Figure 16:
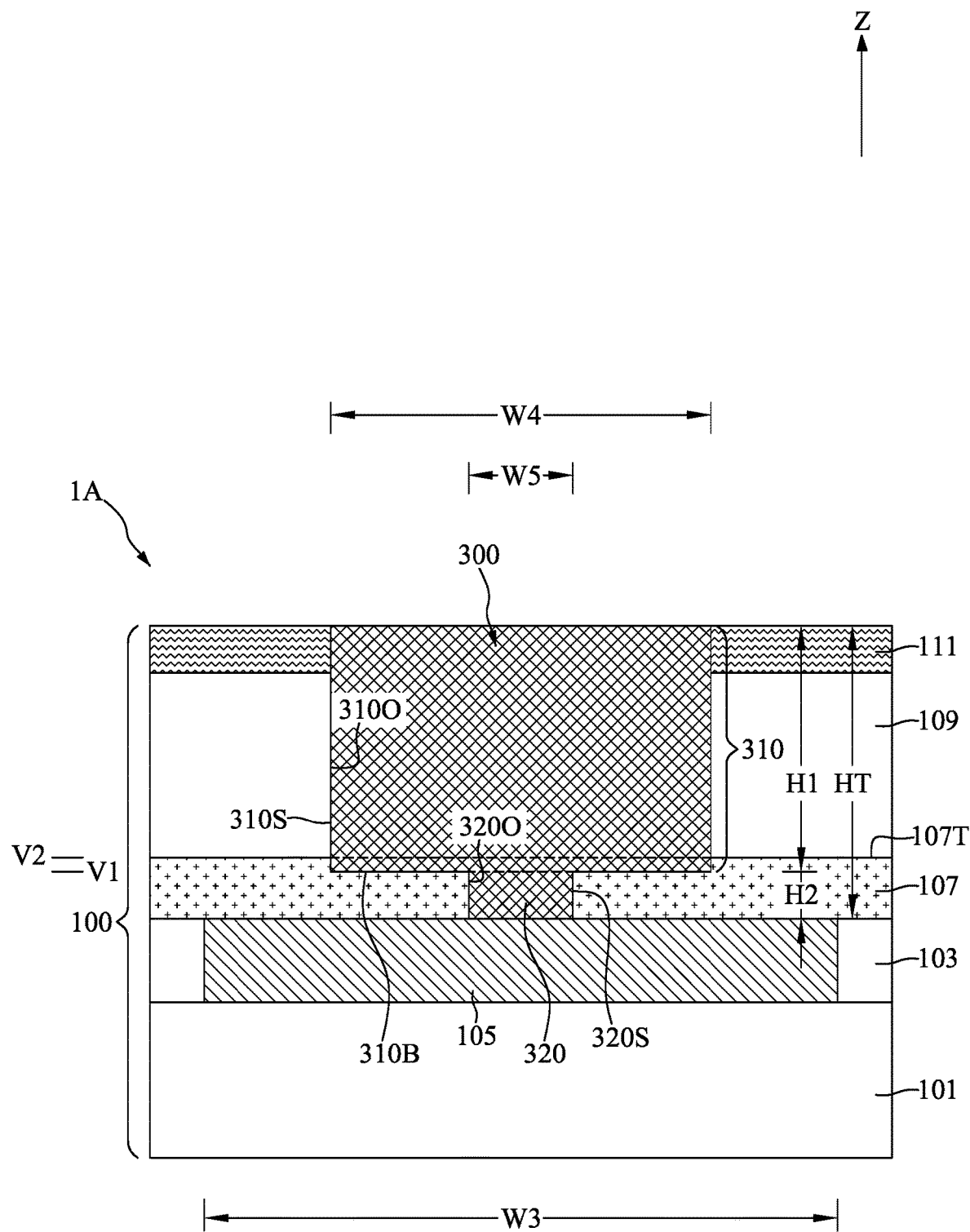

With reference to FIGS. 1, 15, and 16, at step S17, a contact structure 300 may be formed in the opening 310O of body portion and the opening 320O of contact portion.

With reference to FIG. 15, a layer of first conductive material 605 may be deposited into the opening 310O of body portion and the opening 320O of contact portion by a deposition process. The first conductive material 605 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 16, after the deposition process, a planarization process, such as chemical mechanical polishing, may be performed until the top surface of the second dielectric layer 111 is exposed to remove excess material, provide a substantially flat surface for subsequent processing steps, and conformally form the contact structure 300 in the opening 310O of body portion and the opening 320O of contact portion. The substrate 101, the bottom dielectric layer 103, the bottom conductive layer 105, the etch stop layer 107, the first inter-dielectric layer 109, the second dielectric layer 111, and the contact structure 300 together configure the semiconductor device 1A.

With reference to FIG. 16, the contact structure 300 may be referred to as the CO in the present embodiment and may include a body portion 310 and a contact portion 320. The body portion 310 may be formed in the opening 310O of body portion and the contact portion 320 may be formed in the opening 320O of contact portion and contacting the bottom conductive layer 105 and the body portion 310. In the present embodiment, the bottom surface 310B of the body portion 310 may be at a vertical level V1 lower than a vertical level V2 of the top surface 107T of the etch stop layer 107.

In some embodiments, the sidewall 310S of the body portion 310 may be substantially vertical. In some embodiments, the sidewall 320S of the contact portion 320 may be substantially vertical. It should be noted that, in the description of the present disclosure, a surface (i.e., the sidewall 310S or the sidewall 320S) is "substantially planar" if there exists a vertical plane from which the surface does not deviate by more than three times the root mean square roughness of the surface. Alternatively, in some embodiments, the sidewall 320S of the contact portion 320 may be tapered if the second stage of the opening process using a polymer-rich etching process.

In some embodiments, the width W4 of the body portion 310 may be greater than the width W5 of the contact portion 320. In some embodiments, the width ratio of the width W5 of the contact portion 320 to the width W4 of the body portion 310 may be between about 10% and about 75% or between about 30% and about 60%. In some embodiments, the width W3 of the bottom conductive layer 105 may be greater than the width W4 of the body portion 310. In some embodiments, the width ratio of the width W4 of the body portion 310 to the width W3 of the bottom conductive layer 105 may be between about 5% and about 70% or between about 10% and about 50%.

In some embodiments, the height H1 of the body portion 310 may be greater than the height H2 of the contact portion 320. The sum of the height H1 of the body portion 310 and the height H2 of the contact portion 320 may be referred to as the total height HT of the contact structure 300. In some embodiments, the height ratio of the height H2 of the contact portion 320 to the total height HT of the contact structure 300 may be between 5% and about 45%, between about 5% and about 25%, or between about 5% and about 15%.

Conventionally, to increase the overlay window of CO to MO, a polymer-rich etching process may be employed, and a contact having tapered sidewall may be obtained. However, the tapered sidewall of the contact may increase the contact resistance and increase the risk of under-etching.

In contrast, by employing the photomask 500A including the translucent layer 505, the contact structure 300 may be formed with vertical contact sidewalls 310S, 320S while keeping the overlay window of CO to MO large enough. That is, the contact resistance may be improved, and the risk of under-etching may be reduced. As a result, the yield and/or performance of the resulting semiconductor device 1A may be improved.

Figure 17:
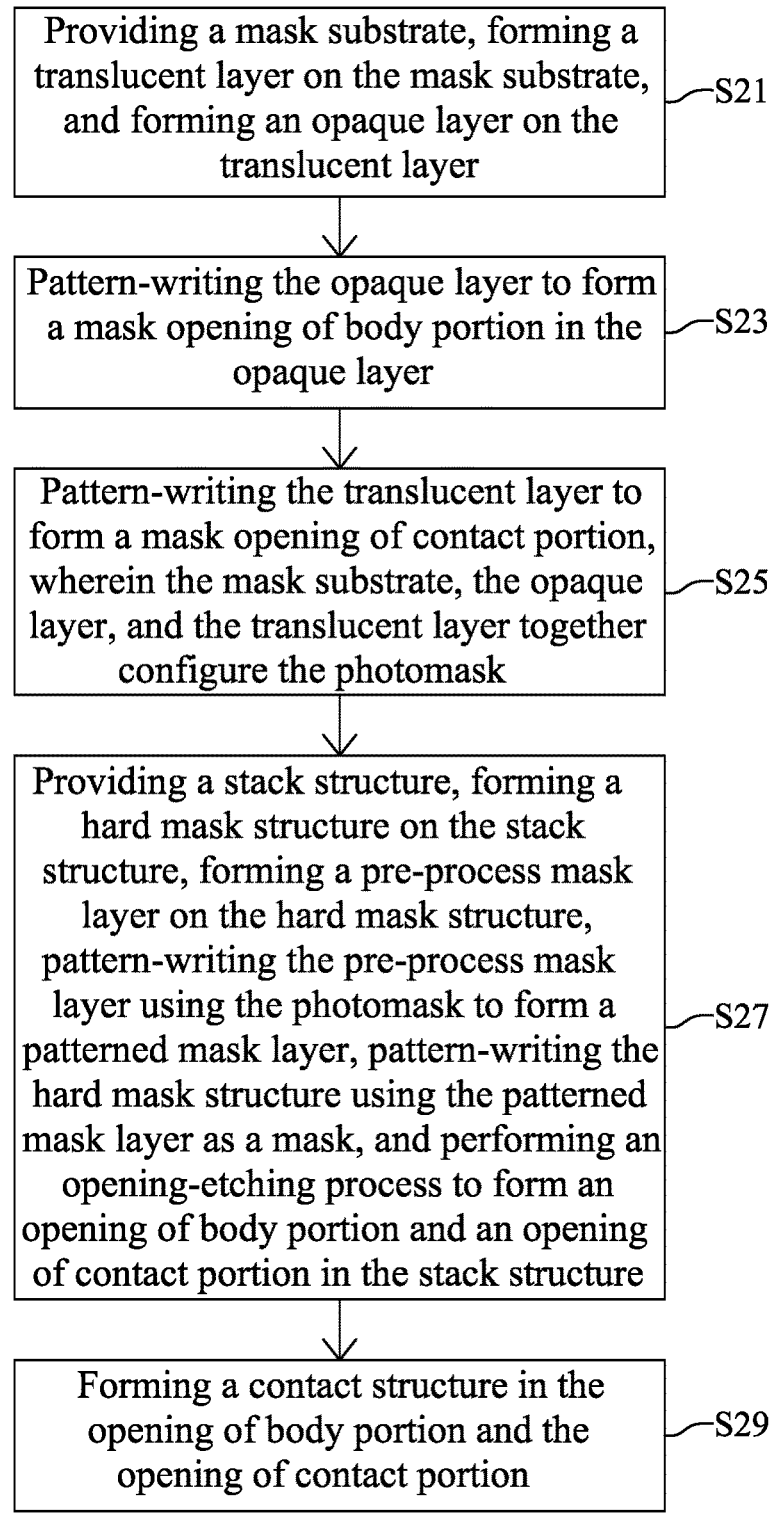
FIG. 17 illustrates, in a flowchart diagram form, a method for fabricating a semiconductor device using a photomask in accordance with another embodiment of the present disclosure.

FIG. 17 illustrates, in a flowchart diagram form, a method 20 for fabricating a semiconductor device 1B using a photomask 500B in accordance with another embodiment of the present disclosure. FIGS. 18 to 26 illustrate, in schematic cross-sectional view diagrams, a flow for fabricating the semiconductor device 1B using the photomask 500B in accordance with another embodiment of the present disclosure.

Figure 18:
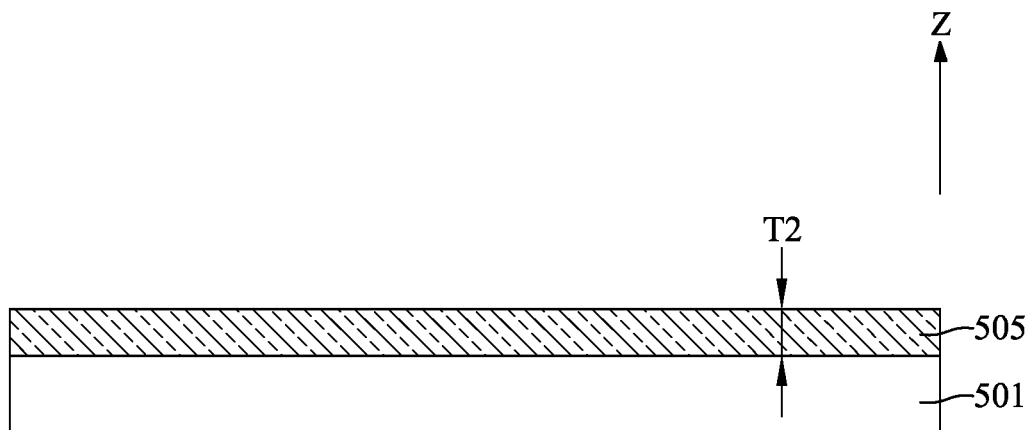
FIGS. 18 to 26 illustrate, in schematic cross-sectional view diagrams, a flow for fabricating the semiconductor device using the photomask in accordance with another embodiment of the present disclosure.
Figure 19:
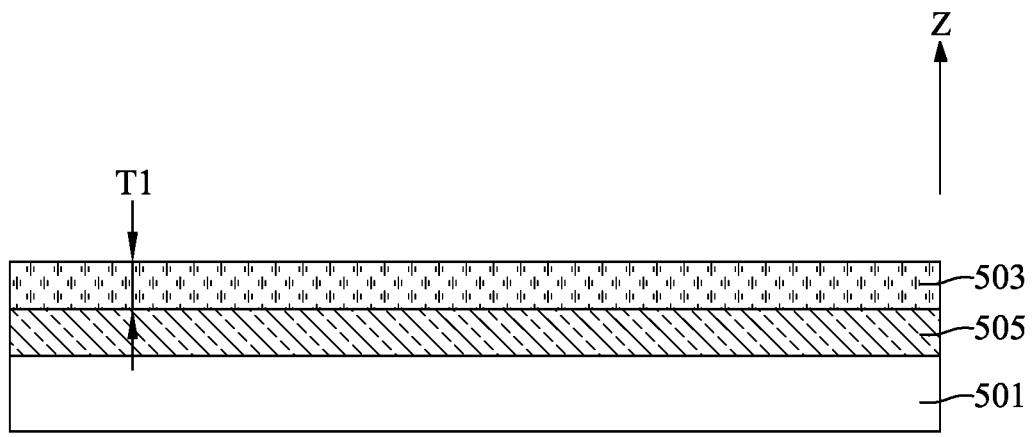

With reference to FIGS. 17 to 19, at step S21, a mask substrate 501 may be provided, a translucent layer 505 may be formed on the mask substrate 501, and an opaque layer 503 may be formed on the translucent layer 505.

With reference to FIG. 18, the mask substrate 501 may have a structure similar to the mask substrate 501 illustrated in FIG. 2, and descriptions thereof are not repeated herein.

The translucent layer 505 may be formed on the mask substrate 501 and completely cover the mask substrate 501. The thickness T2, the material, the opacity of the translucent layer 505 may be similar to the translucent layer 505 illustrated in FIG. 4, and descriptions thereof are not repeated herein.

With reference to FIG. 19, the opaque layer 503 may be formed on the translucent layer 505. It should be noted that the opaque layer 503 may be opposite to the mask substrate 501 with the translucent layer 505 interposed therebetween in the present embodiment. The thickness T1, the material, the opacity of the opaque layer 503 may be similar to the opaque layer 503 illustrated in FIG. 2, and descriptions thereof are not repeated herein.

Figure 20:
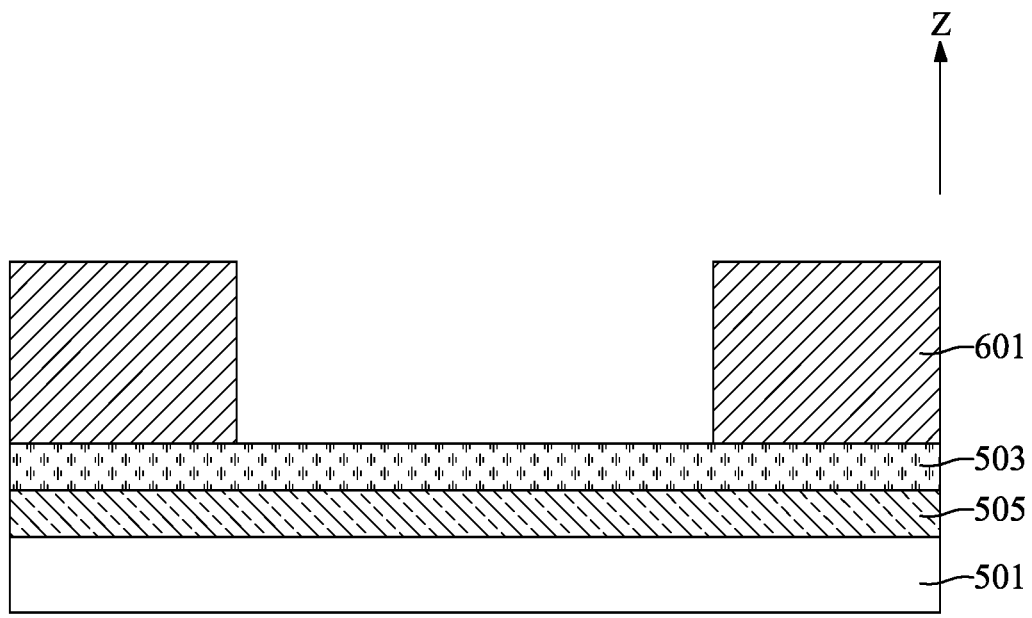
Figure 21:
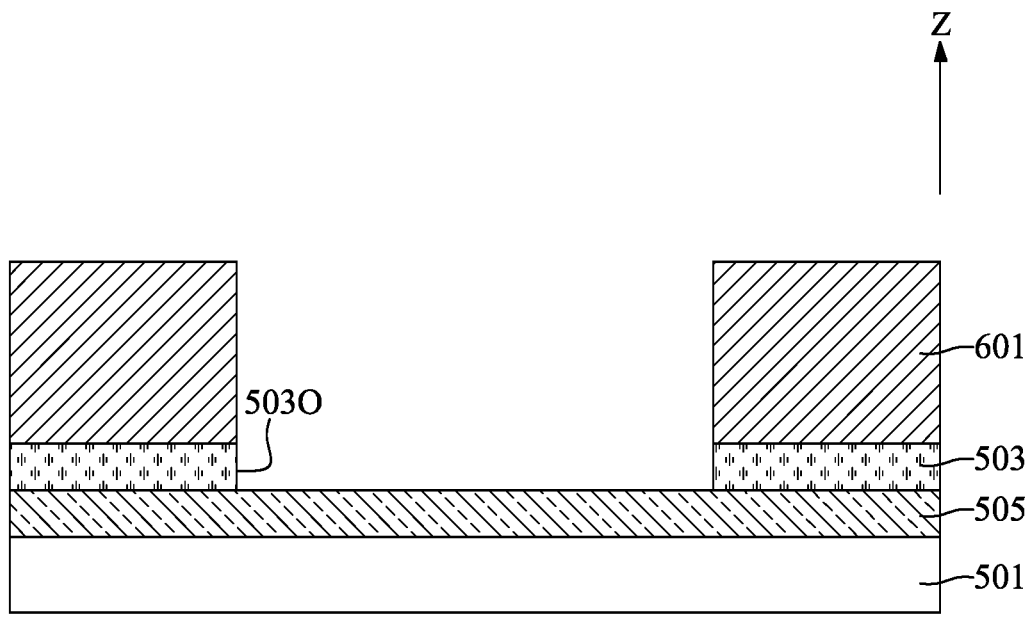

With reference to FIGS. 17, 20, and 21, at step S23, the opaque layer 503 may be pattern-written to form a mask opening 503O of body portion in the opaque layer 503.

With reference to FIG. 20, a first mask layer 601 may be formed on the opaque layer 503. The first mask layer 601 may have a structure similar to the first mask layer 601 illustrated in FIG. 2, and descriptions thereof are not repeated herein.

With reference to FIG. 21, a first etching process using the first mask layer 601 as a mask may be performed to remove a portion of the opaque layer 503. After the first etching process, the mask opening 503O of body portion may be formed in the opaque layer 503. A first portion of the top surface of the translucent layer 505 may be exposed through the mask opening 503O of body portion. In some embodiments, the etch rate ratio of the opaque layer 503 to the translucent layer 505 may be between about 100:1 and about 1.05:1, between about 15:1 and about 2:1, or between about 10:1 and about 2:1 during the first etching process. After the mask opening 503O of body portion is formed, the first mask layer 601 may be removed.

Figure 22:
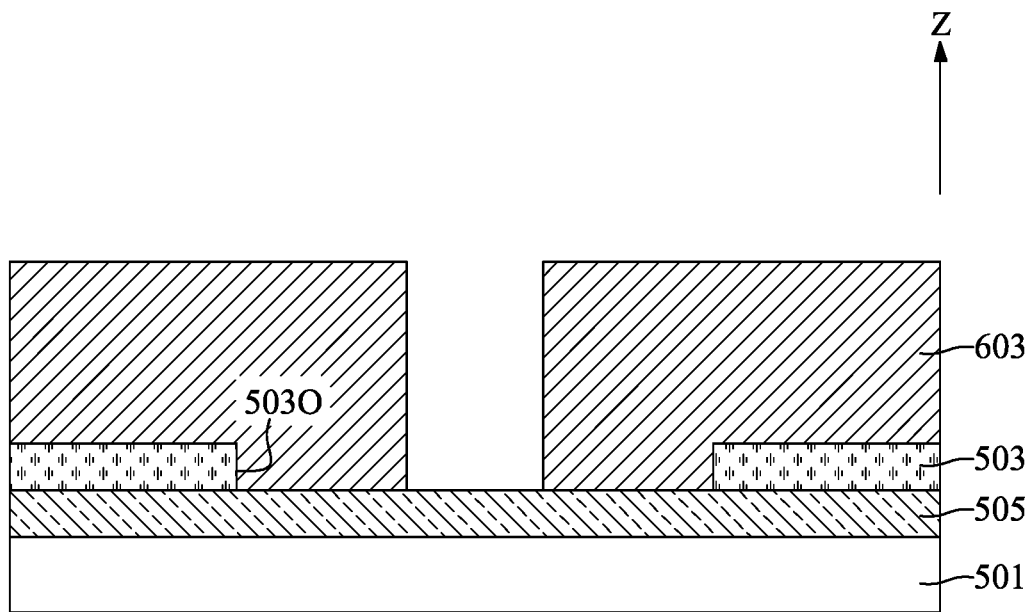
Figure 23:
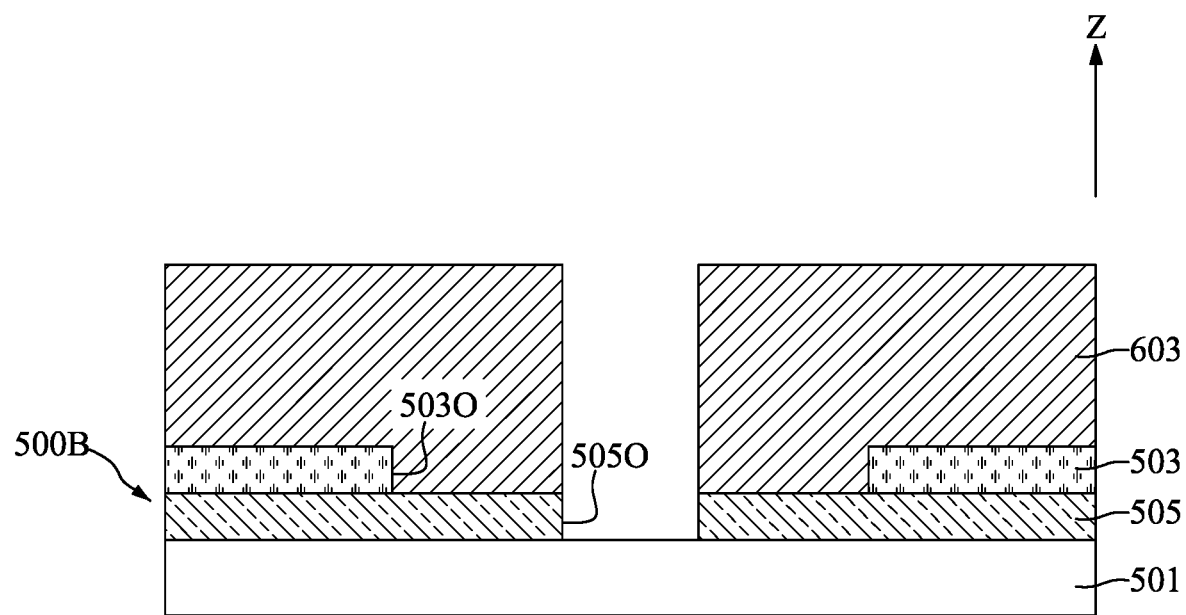

With reference to FIGS. 17, 22, and 23, at step S25, the translucent layer 505 may be pattern-written to form a mask opening 505O of contact portion, wherein the mask substrate 501, the opaque layer 503, and the translucent layer 505 together configure the photomask 500B.

With reference to FIG. 22, a second mask layer 603 may be formed on the opaque layer 503 and the translucent layer 505. The second mask layer 603 may have a structure similar to the second mask layer 603 illustrated in FIG. 5, and descriptions thereof are not repeated herein.

With reference to FIG. 23, a second etching process may be performed with a procedure similar to that illustrated in FIG. 6, and descriptions thereof are not repeated herein.

With reference to FIG. 17 and FIGS. 24 to 26, at step S27, a stack structure 100 may be provided, a hard mask structure 200 may be formed on the stack structure 100, a pre-process mask layer 401 may be formed on the hard mask structure 200, the pre-process mask layer 401 may be pattern-written using the photomask 500B to form a patterned mask layer 403, the hard mask structure 200 may be pattern-written using the patterned mask layer 403 as a mask, and an opening-etching process may be performed to form an opening 310O of body portion and an opening 320O of contact portion in the stack structure 100.

Figure 24:
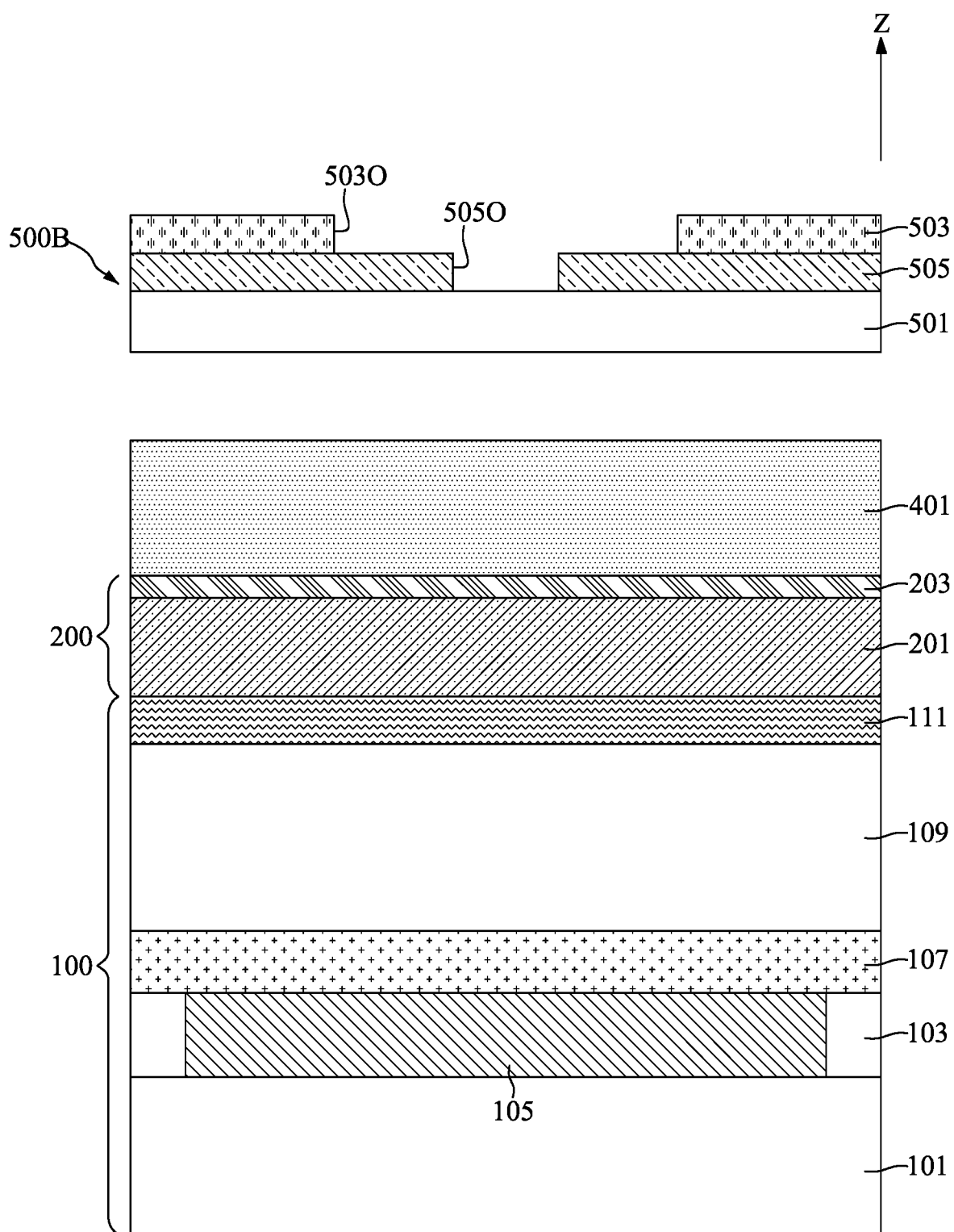

With reference to FIG. 24, the stack structure 100, the hard mask structure 200, and the pre-process mask layer 401 may have structures similar to that illustrated in FIG. 7. The same or similar elements in FIG. 24 as in FIG. 7 have been marked with similar reference numbers and duplicative descriptions have been omitted.

Figure 25:
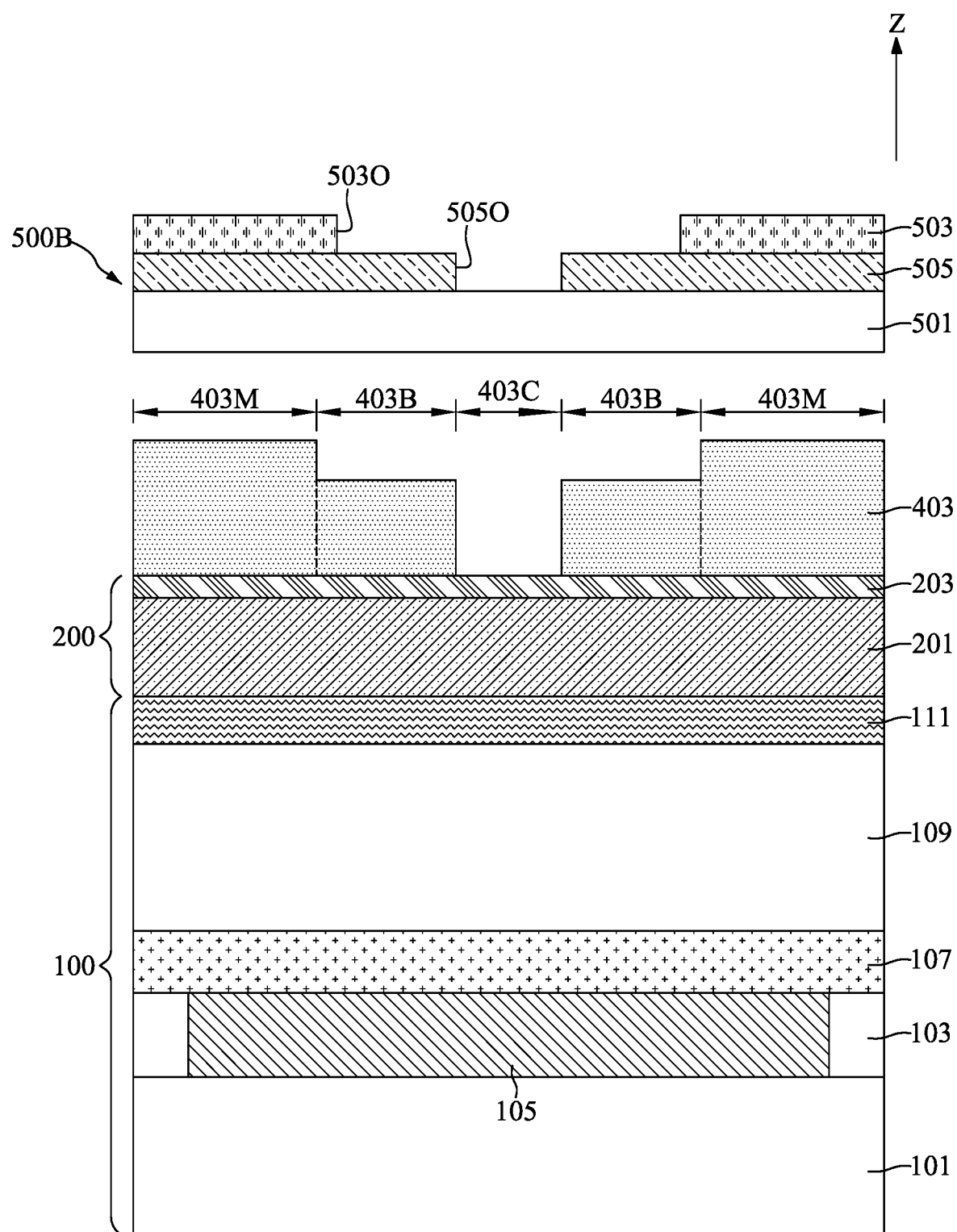

With reference to FIG. 25, the pre-process mask layer 401 may be pattern-written to form the patterned mask layer 403 with a procedure similar to that illustrated in FIG. 8, and descriptions thereof are not repeated herein.

Figure 26:
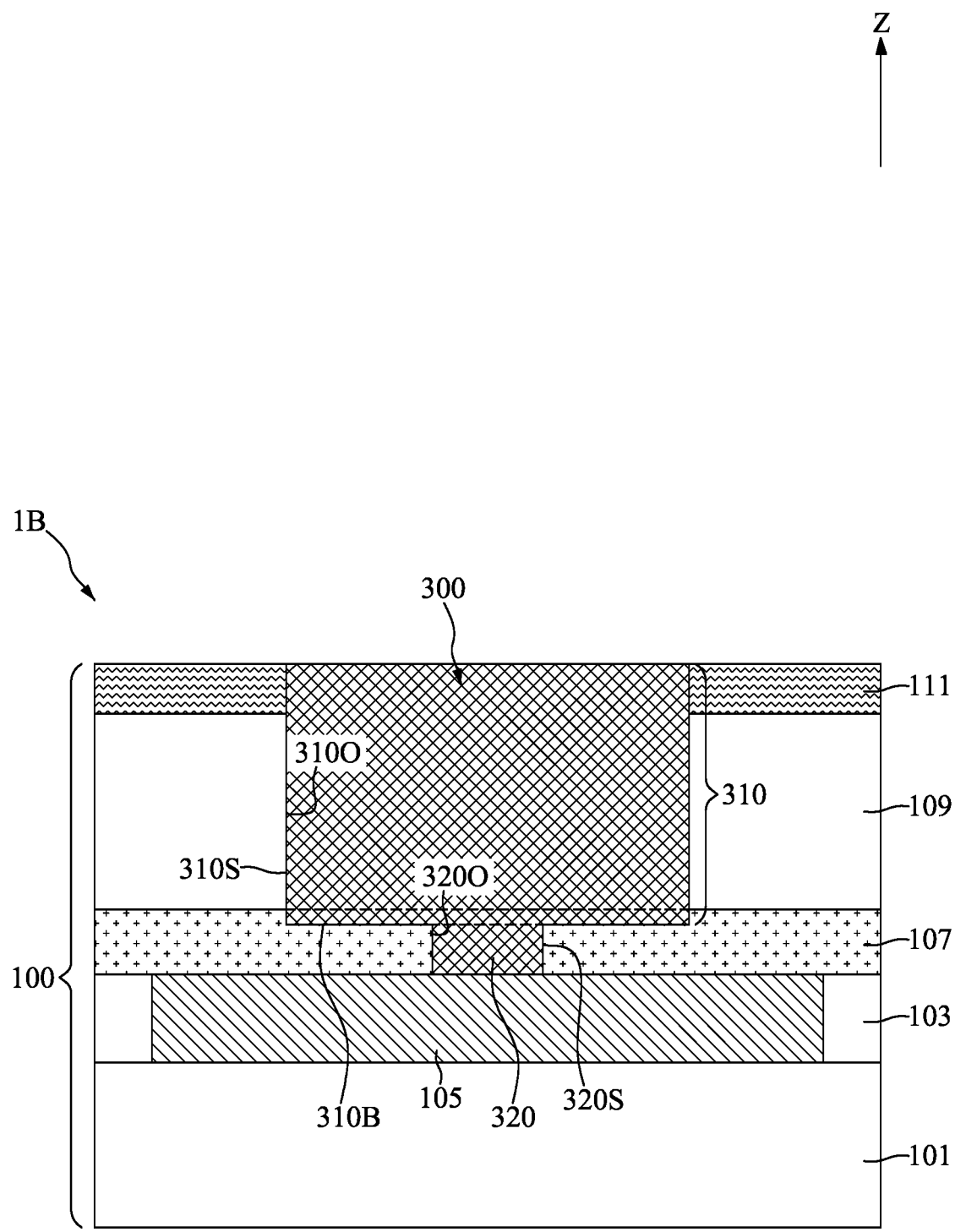

With reference to FIG. 26, the hard-mask-etching process and the opening-etching process may be performed with a procedure similar to that illustrated in FIGS. 9 to 14, and descriptions thereof are not repeated herein.

With reference to FIGS. 17, 25, and 26, at step S29, a contact structure 300 may be formed in the opening 310O of body portion and the opening 320O of contact portion.

With reference to FIG. 25, the contact structure 300 may be formed with a procedure similar to that illustrated in FIGS. 15 and 16, and descriptions thereof are not repeated herein. The substrate 101, the bottom dielectric layer 103, the bottom conductive layer 105, the etch stop layer 107, the first inter-dielectric layer 109, the second dielectric layer 111, and the contact structure 300 together configure the semiconductor device 1B.

Figure 27:
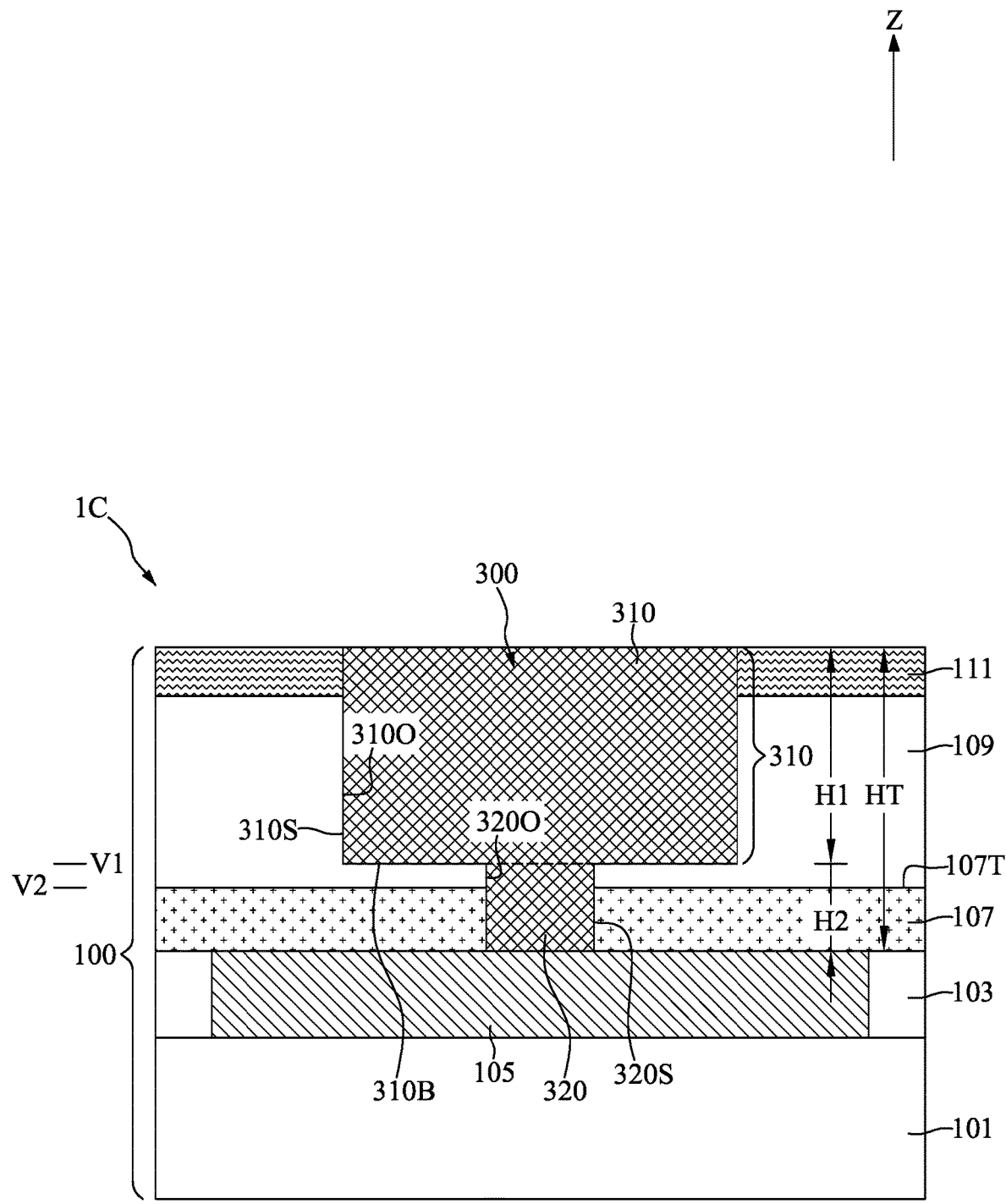
FIG. 27 illustrates, in a schematic cross-sectional view diagram, a semiconductor device in accordance with another embodiment of the present disclosure.

FIG. 27 illustrates, in a schematic cross-sectional view diagram, a semiconductor device 1C in accordance with another embodiment of the present disclosure.

With reference to FIG. 27, the semiconductor device 1C may have a structure similar to that illustrated in FIG. 16. The same or similar elements in FIG. 27 as in FIG. 16 have been marked with similar reference numbers and duplicative descriptions have been omitted.

With reference to FIG. 27, the bottom surface 310B of the body portion 310 may be at a vertical level V1 higher than a vertical level V2 of the top surface 107T of the etch stop layer 107. The height ratio of the height H2 of the contact portion 320 to the total height HT of the contact structure 300 may be between 15% and about 45%, between about 15% and about 25%, or between about 15% and about 20%.

One aspect of the present disclosure provides a semiconductor device including a bottom dielectric layer positioned on a substrate; a bottom conductive layer positioned in the bottom dielectric layer; an etch stop layer positioned on the bottom conductive layer; a first inter-dielectric layer positioned on the etch stop layer; and a contact structure including a body portion positioned along the first inter-dielectric layer and extending to the etch stop layer, and a contact portion positioned in the etch stop layer and contacting the body portion and the bottom conductive layer. A width of the body portion is greater than a width of the contact portion.

Another aspect of the present disclosure provides a method for fabricating a semiconductor device including providing a photomask including an opaque layer on a mask substrate and surrounding a translucent layer on the mask substrate, wherein the translucent layer includes a mask opening of contact portion which exposes a portion of the mask substrate; providing a stack structure including an etch stop layer on a bottom conductive layer and a first inter-dielectric layer on the etch stop layer, and forming a pre-process mask layer on the stack structure; patterning the pre-process mask layer using the photomask to form a patterned mask layer including a mask region corresponding to the opaque layer, a region of body portion corresponding to the translucent layer, and a hole of contact portion corresponding to the mask opening of contact portion, wherein a thickness of the region of body portion is less than a thickness of the mask region; performing an opening-etching process to form an opening of body portion and an opening of contact portion in the stack structure to expose a portion of the bottom conductive layer; and forming a contact structure in the opening of body portion and the opening of contact portion. A width of the opening of body portion is greater than a width of the opening of contact portion.

Another aspect of the present disclosure provides a method for fabricating a semiconductor device including providing a photomask including a translucent layer on a mask substrate and including a mask opening of contact portion which exposes a portion of the mask substrate, and an opaque layer on the translucent layer and including a mask opening of body portion which exposes a portion of the translucent layer and the portion of the mask substrate; providing a stack structure including an etch stop layer on a bottom conductive layer and a first inter-dielectric layer on the etch stop layer, and forming a pre-process mask layer on the stack structure; patterning the pre-process mask layer using the photomask to form a patterned mask layer including a mask region corresponding to the opaque layer, a region of body portion corresponding to the translucent layer, and a hole of contact portion corresponding to the mask opening of contact portion; and performing an opening-etching process to form an opening of body portion and an opening of contact portion in the stack structure to expose a portion of the bottom conductive layer, and forming a contact structure in the opening of body portion and the opening of contact portion. A thickness of the region of body portion is less than a thickness of the mask region. A width of the opening of body portion is greater than a width of the opening of contact portion.

Due to the design of the semiconductor device of the present disclosure, the contact structure 300 formed by using the photomask 500A including the translucent layer 505 may have vertical contact sidewalls while keeping the overlay window of the contact structure 300 to the bottom conductive layer 105 large enough. Therefore, the contact resistance may be improved, and the risk of under-etching may be reduced. As a result, the yield and/or performance of the resulting semiconductor device 1A may be improved.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a bottom dielectric layer positioned on a substrate;
a bottom conductive layer positioned in the bottom dielectric layer;
an etch stop layer positioned on the bottom conductive layer, wherein the etch stop layer is a single layer made of silicon carbonitride, or silicon oxycarbide, wherein a height of the bottom conductive layer is equal to a thickness of the bottom dielectric layer, such that a bottom surface of the bottom conductive layer is in contact with a top surface of the substrate while a top surface of the bottom conductive layer is in contact with a bottom surface of the etch stop layer;
a first inter-dielectric layer positioned on the etch stop layer, wherein the first inter-dielectric layer is a single layer, wherein the first inter-dielectric layer and the etch stop layer are made of different materials; and
a contact structure comprising:
a body portion positioned along the first inter-dielectric layer and extending to the etch stop layer, wherein a bottom surface of the body portion is positioned below a top surface of the etch stop layer; and
a contact portion positioned in the etch stop layer, wherein the contact portion is extended from the body portion and is in contact with a portion of the top surface of the bottom conductive layer, wherein a height of the contact portion is less than a thickness of the etch stop layer;
wherein a width of the body portion is greater than a width of the contact portion;
wherein a height of the body portion is greater than a height of the bottom conductive layer;
wherein a height of the contact portion is less than a height of the etch stop layer;
wherein a width of the bottom conductive layer is greater than the width of the body portion of the contact structure.

2. The semiconductor device of claim 1, wherein a sidewall of the body portion is substantially vertical.

3. The semiconductor device of claim 2, wherein a sidewall of the contact portion is substantially vertical.

4. The semiconductor device of claim 3, wherein a width ratio of the width of the contact portion to the width of the body portion is between about 10% and about 75%.

5. The semiconductor device of claim 4, wherein the height of the body portion is greater than the height of the contact portion.

6. The semiconductor device of claim 5, wherein a height ratio of the height of the contact portion to a total height of the contact structure is between 5% and about 45%.

7. The semiconductor device of claim 6, wherein a width ratio of the width of the body portion to the width of the bottom conductive layer is between about 5% and about 70%.

8. The semiconductor device of claim 7, further comprising a second dielectric layer formed on the first inter-dielectric layer, wherein the body portion of the contact structure is positioned along the second dielectric layer and the first inter-dielectric layer, and extending to the etch stop layer, such that the height of the body portion of the contact structure is greater than an overall thickness of the first dielectric layer and the second inter-dielectric layer.

9. The semiconductor device of claim 8, wherein the first inter-dielectric layer and the second dielectric layer comprise the same material.

10. The semiconductor device of claim 9, wherein the second dielectric layer comprises a self-planarizing material.

11. The semiconductor device of claim 1, further comprising:
a first opening formed at the first inter-dielectric layer and extended into the etch stop layer at a position that a bottom wall of the first opening is indented from the top surface of the etch stop layer, wherein the body portion is received in the first opening, such that the bottom surface of the body portion is positioned below the top surface of the etch stop layer;
a second opening formed at the etch stop layer below the top surface thereof and communicated with the first opening, wherein the contact portion is received in the second opening, such that the height of the contact portion is less than a thickness of the etch stop layer; and
a first conductive material deposited in the first opening and the second opening concurrently to form the body portion within the first opening and the contact portion within the second opening.

12. The semiconductor device of claim 1, wherein the contact structure is made of tungsten, cobalt, zirconium, tantalum, titanium, aluminum, copper, metal carbides, metal nitrides, transition metal aluminides, or a combination thereof.

* * * * *